(12) United States Patent
Shiomi

(10) Patent No.: US 6,385,081 B1
(45) Date of Patent: May 7, 2002

(54) SEMICONDUCTOR INTEGRATED CIRCUIT

(75) Inventor: Toru Shiomi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/808,181

(22) Filed: Mar. 15, 2001

(30) Foreign Application Priority Data

Sep. 4, 2000 (JP) ........................................ 2000-266988

(51) Int. Cl.⁷ .............................................. G11C 11/00
(52) U.S. Cl. ...................... 365/154; 365/156; 365/201; 365/225.7
(58) Field of Search ................................ 365/154, 156, 365/201, 225.7

(56) References Cited

U.S. PATENT DOCUMENTS

| | | | | |
|---|---|---|---|---|
| 5,365,475 A | * | 11/1994 | Matsumura et al. | ........ 365/154 |
| 5,898,611 A | * | 4/1999 | Yamada | ...................... 365/154 |
| 5,936,892 A | * | 8/1999 | Wendell | ...................... 365/156 |
| 5,973,985 A | * | 10/1999 | Ferrant | ........................ 365/156 |

FOREIGN PATENT DOCUMENTS

| | | |
|---|---|---|
| JP | 5-314790 | 11/1993 |
| JP | 8-45299 | 2/1996 |
| JP | 8-138399 | 5/1996 |

\* cited by examiner

*Primary Examiner*—Trong Phan
(74) *Attorney, Agent, or Firm*—McDermott, Will & Emery

(57) ABSTRACT

A semiconductor integrated circuit identifies and salvages defective memory cells producing a dc current error, such as a standby current fault, and thereby improves semiconductor chip yield. During the wafer test stage of the manufacturing process, a positive and negative supply voltage are both applied to the two inverter circuits 8, 9 of the SRAM memory cell 1 to detect defective memory cells where a microshort occurs. The fuse inserted the supply line of the detected defective memory cell is then broken to interrupt applying a positive or negative supply voltage to the defective memory cell, and a redundant memory cell provided in the memory cell array is substituted for the defective memory cell.

20 Claims, 19 Drawing Sheets

SEMICONDUCTOR INTEGRATED CIRCUIT

BACKGROUND OF THE INVENTION

1. Field of the Invention

The present invention relates to a semiconductor integrated circuit having a memory cell array and, more particularly, to the semiconductor integrated circuit that can detect and identify a shortcircuit between a storage node and a power terminal in a memory cell to thereby improve the production yield.

2. Description of Related Art

FIG. 16 is a circuit diagram of a conventional SRAM memory cell in a semiconductor integrated circuit (referred to below as an IC device). FIG. 17 shows a microshort between a positive supply terminal and a memory node B in the memory cell shown in FIG. 16, and FIG. 18 shows a microshort between a memory node A and a negative supply terminal.

As shown in FIG. 17, microshorts can occur between memory node B of the memory cell 100 and the positive supply terminal 101 of the cell to which positive supply voltage VCCM is applied during the memory cell manufacturing process of an IC device due to the inclusion of etching remnants and other foreign matter. A high resistance 108 is thus produced where the microshort occurs, and the positive supply terminal 101 and memory node B of the memory cell are thus connected by this high resistance 108.

A microshort can likewise occur during the memory cell manufacturing process of an IC device due to the inclusion of etching remnants and other foreign matter between the grounded negative supply terminal 102 of the memory cell and memory node A of the memory cell 100 as shown in FIG. 18. A high resistance 108 is likewise formed where the microshort occurs, and memory node A and the negative supply terminal 102 are thus connected by this high resistance 108.

When the voltage level of memory node B, which is the node between the drain of p-channel MOS transistor 104 (referred to as simply a PMOS transistor below) and the drain of n-channel MOS transistor 106 (referred to as simply an NMOS transistor below), goes low, current flows from positive supply terminal 101 of the memory cell through high resistance 108 and NMOS transistor 106 to ground. Because this through-current flows even when the memory cell is in the standby mode, the semiconductor chip in which the SRAM device is formed will have a standby state error.

When the resistance of this high resistance 108 is sufficiently high compared with the on resistance of NMOS transistor 106, there is no particular effect with respect to the function of the semiconductor chip itself, and it is apparent only as an increase in the standby current of the semiconductor chip. This means that the memory cell in which the standby current increases cannot be identified, even semiconductor chips having a redundancy circuit cannot be salvaged, and ultimately the chip must be treated as defective.

Furthermore, when node A, i.e., the node between the drain of PMOS 103 and the drain of NMOS 105, goes high, current flows from positive supply terminal 101 of the memory cell through PMOS 103 and high resistance 108 to ground as shown in FIG. 18. Because this through-current flows even when the memory cell is in the standby mode, the semiconductor chip in which the SRAM device is formed will have a standby state error.

When the resistance of this high resistance 108 is sufficiently high compared with the on resistance of PMOS transistor 103, there is no particular effect with respect to the function of the semiconductor chip itself, and it is apparent only as an increase in the standby current of the semiconductor chip. This means that the memory cell in which the standby current increases cannot be identified, even semiconductor chips having a redundancy circuit cannot be salvaged, and ultimately the chip must be treated as defective.

By providing power supply pads 111 and 112 for memory cell array 123, and power supply pads 113, 114 for peripheral circuits 121, 122, as shown in FIG. 19, however, it is possible to detect whether the standby current leak originates in peripheral circuits 121, 122 or memory cell array 123. This information can then be used for process improvement. However, if the standby current defect is due to a fault in the memory cell array 123, it is still difficult using the configuration shown in FIG. 19 to identify which memory cell in the memory cell array 123 is at fault, and it is therefore still not possible to salvage the chip using the redundant circuit.

Japanese Patent Laid-open Publication No. 8-45299 teaches a method for detecting dc current faults in a semiconductor memory device and memory cell, and Japanese Patent Laid-open Publication No. 8-138399 teaches a semiconductor device designed to recover from standby current errors. It is important to note, however, that both of these disclosures differ from the present invention in that they do not teach a method for identifying the defective memory cell as part of a chip salvage technique.

SUMMARY OF THE INVENTION

Considering the aforementioned problem, it is therefore an object of the present invention to provide a semiconductor integrated circuit whereby the defective memory cell can be identified when a standby current defect or other dc current leak occurs, and semiconductor chip production yield can therefore be improved.

To achieve this object, each memory cell of a semiconductor integrated circuit having a memory cell array of SRAM memory cells according to the present invention comprises a first positive supply terminal to which a specific first positive supply voltage is applied during wafer testing; a second positive supply terminal to which a specific second positive supply voltage is applied during wafer testing; a negative supply terminal to which a specific negative supply voltage is applied; a first inverter circuit of which the supply voltages applied to the first positive supply terminal and negative supply terminal are the power supply; and a second inverter circuit of which the supply voltages applied to the second positive supply terminal and negative supply terminal are the power supply.

Preferably in this case, a specific positive supply voltage is applied during normal operation to the first positive supply terminal and second positive supply terminal.

Yet further preferably, each memory cell also has an n-well voltage input terminal whereby an n-well voltage is applied to each MOS transistor of the first and second inverter circuits.

Yet further preferably, the first positive supply voltage or the second positive supply voltage, whichever higher, is applied to the n-well voltage input terminal during wafer testing.

In a further semiconductor integrated circuit having a memory cell array of SRAM memory cells according to the present invention, each memory cell comprises a positive supply terminal to which a specific positive supply voltage is applied; a first negative supply terminal to which a specific first negative supply voltage is applied during wafer testing; a second negative supply terminal to which a specific second negative supply voltage is applied during wafer testing; a first inverter circuit of which the supply voltages applied to the positive supply terminal and first negative supply terminal are a power supply; and a second inverter circuit of which the supply voltages applied to the positive supply terminal and second negative supply terminal are a power supply.

Preferably in this case a specific negative supply voltage is applied during normal operation to the first negative supply terminal and second negative supply terminal.

Yet further preferably, each memory cell further comprises a p-well voltage input terminal whereby a p-well voltage is applied to each MOS transistor of the first and second inverter circuits.

Yet further preferably, the first negative supply voltage or the second negative supply voltage, whichever lower, is applied to the p-well voltage input terminal during wafer testing.

In yet a further semiconductor integrated circuit having a memory cell array of SRAM memory cells according to the present invention, each memory cell comprises a first positive supply terminal to which a specific first positive supply voltage is applied during wafer testing; a first negative supply terminal to which a specific first negative supply voltage is applied during wafer testing; a second positive supply terminal to which a specific second positive supply voltage is applied during wafer testing; a second negative supply terminal to which a specific second negative supply voltage is applied during wafer testing; a first inverter circuit of which the supply voltages applied to the first positive supply terminal and first negative supply terminal are a power supply; and a second inverter circuit of which the supply voltages applied to the second positive supply terminal and second negative supply terminal are a power supply.

In this semiconductor integrated circuit, a specific positive supply voltage is preferably applied during normal operation to the first positive supply terminal and second positive supply terminal, and a specific negative supply voltage is applied during normal operation to the first negative supply terminal and second negative supply terminal.

Yet further preferably, each memory cell further comprises an n-well voltage input terminal whereby an n-well voltage is applied to each MOS transistor of the first and second inverter circuits, and a p-well voltage input terminal whereby a p-well voltage is applied to each MOS transistor of the first and second inverter circuits.

Yet further preferably, the first positive supply voltage or the second positive supply voltage, whichever higher, is applied to the n-well voltage input terminal, and the lesser of the first negative supply voltage and the second negative supply voltage is applied to the p-well voltage input terminal, during wafer testing.

Yet further preferably, the semiconductor integrated circuit further comprises a corresponding fuse for breaking each line disposed for applying the first positive supply voltage and second positive supply voltage to each specific memory cell group of the memory cell array.

Yet further preferably, the semiconductor integrated circuit further comprises a corresponding fuse for breaking each line disposed for applying the first negative supply voltage and second negative supply voltage to each specific memory cell group of the memory cell array.

Further preferably, the fuses are arranged alternately above and below or right and left to the memory cell array.

Yet further preferably, the lines are disposed in two layers, and the fuses are disposed to each line in each layer.

Yet further preferably, each memory cell of the memory cell array is a CMOS device.

Other objects and attainments together with a fuller understanding of the invention will become apparent and appreciated by referring to the following description and claims taken in conjunction with the accompanying drawings.

DESCRIPTION OF THE PREFERRED EMBODIMENTS

The preferred embodiments of the present invention are described below with reference to the accompanying figures.

Embodiment 1

Figure 1:
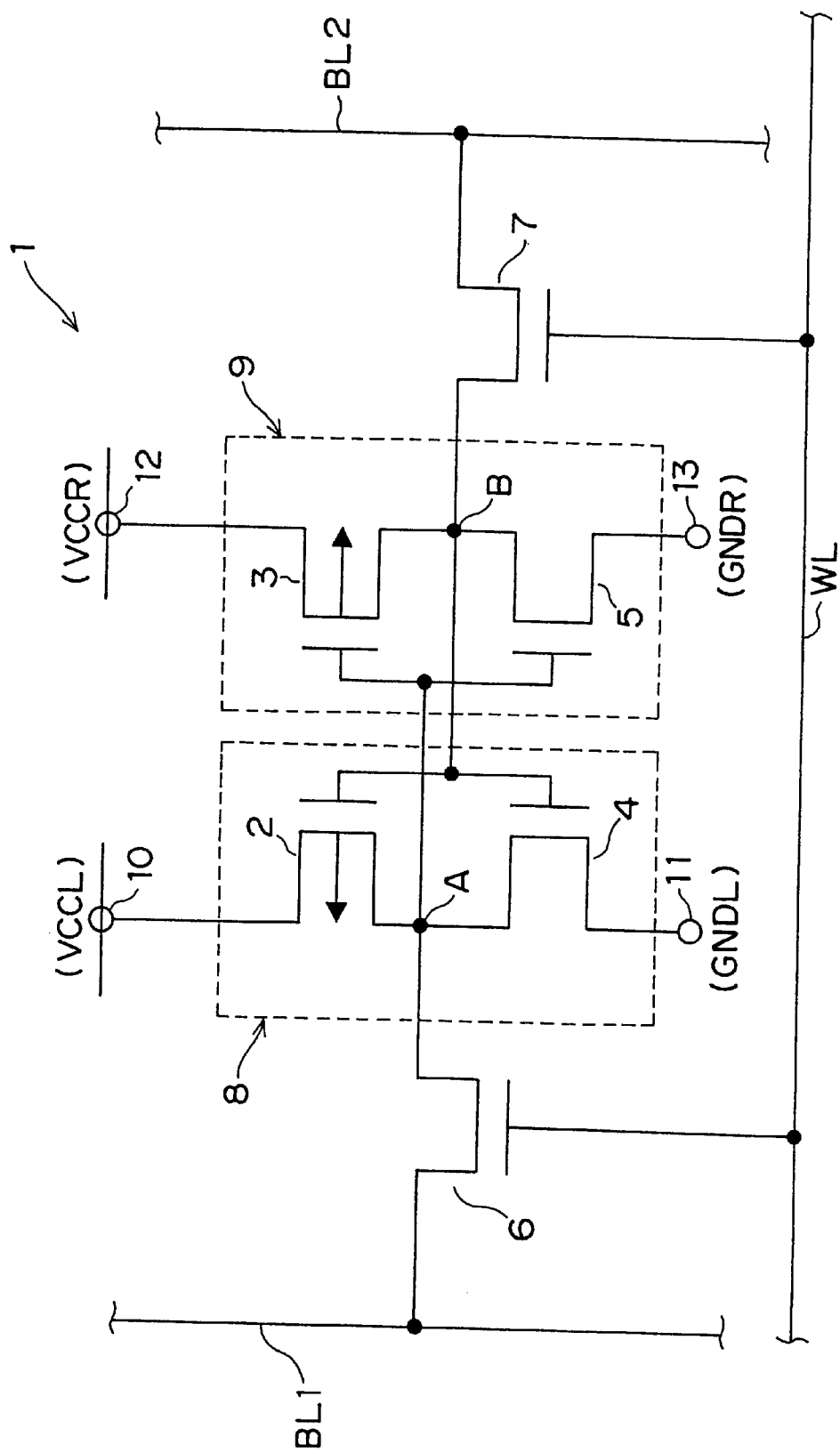
FIG. 1 is a circuit diagram of a semiconductor integrated circuit according to a first embodiment of the present invention.

FIG. 1 circuit diagram of an SRAM memory cell in a semiconductor integrated circuit according to a first preferred embodiment of the present invention.

As shown in FIG. 1, SRAM memory cell 1 comprises PMOS transistors 2 and 3, which are the load; NMOS transistors 4 and 5, which form a flip-flop; and NMOS transistors 6 and 7 for writing and reading the flip-flop. PMOS transistor 2 and NMOS transistor 4 form a first inverter circuit 8, and PMOS transistor 3 and NMOS transistor 5 form a second inverter circuit 9.

PMOS transistor 2 and NMOS transistor 4 are connected in series between first positive supply terminal 10 and first negative supply terminal 11 of the memory cell. The node between NMOS transistor 4 and PMOS transistor 2, which is also the output terminal of first inverter circuit 8, is memory node A. PMOS transistor 3 and NMOS transistor 5 are likewise connected in series between second positive supply terminal 12 and second negative supply terminal 13 of the memory cell. The node between NMOS transistor 5 and PMOS transistor 3, which functions as the output terminal of second inverter circuit 9, is memory node B. The gates of NMOS transistor 5 and PMOS transistor 3, which is the input terminal to the first inverter circuit 8, are connected to memory node A, and the gates of NMOS transistor 4 and PMOS transistor 2, which is the input terminal of second inverter circuit 9, are connected to memory node B.

NMOS transistor 6 is connected between memory node A and bit line BL1, which is one part of a bit line pair, and the gate of NMOS transistor 6 is connected to word line WL. NMOS transistor 7 is likewise connected between memory node B and bit line BL2, the other half of the bit line pair, and the gate of NMOS transistor 7 is connected to word line WL. It should be noted that the signal level of bit line BL1 is the inverse of the signal level of bit line BL2.

Figure 2:
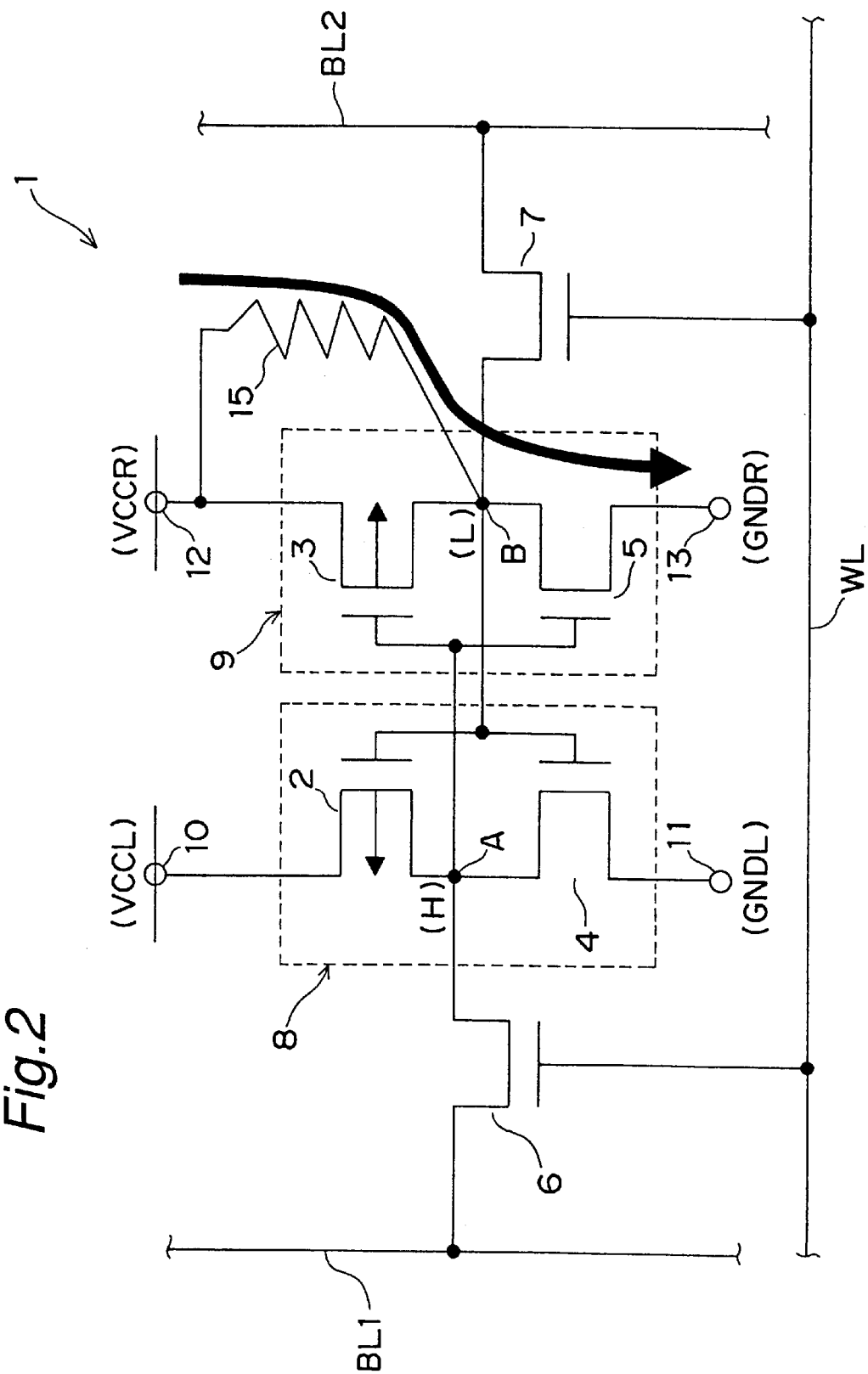
FIG. 2 shows a microshort between memory node B and second positive supply terminal 12 in FIG. 1.

If a microshort occurs due to etching remnants or foreign matter between second positive supply terminal 12 and memory node B as shown in FIG. 2, a high resistance 15 is formed where the microshort occurs, and second positive supply terminal 12 and memory node B are thus connected by this high resistance 15. When the voltage level of memory node B is low, through-current flows from second positive supply terminal 12 to second negative supply terminal 13 by way of high resistance 15 and NMOS transistor 5. This current flows when the memory cell is in the standby state, and the semiconductor chip in which this SRAM cell is formed has a standby state error.

Current supply capacity to this high resistance 15 can be improved during the wafer test stage of the manufacturing process by setting the first positive supply voltage VCCL applied to first positive supply terminal 10 to less than the second positive supply voltage VCCR applied to the second positive supply terminal 12, and setting the first negative supply voltage GNDL applied to first negative supply terminal 11 less than the second negative supply voltage GNDR applied to the second negative supply terminal 13. If the current supply capacity to high resistance 15 thus becomes comparable to the drive current capacity of NMOS transistor 5, the voltage level of memory node B will rise and invert from low to high. This makes it possible to detect that a microshort occurred in memory cell 1.

Figure 3:
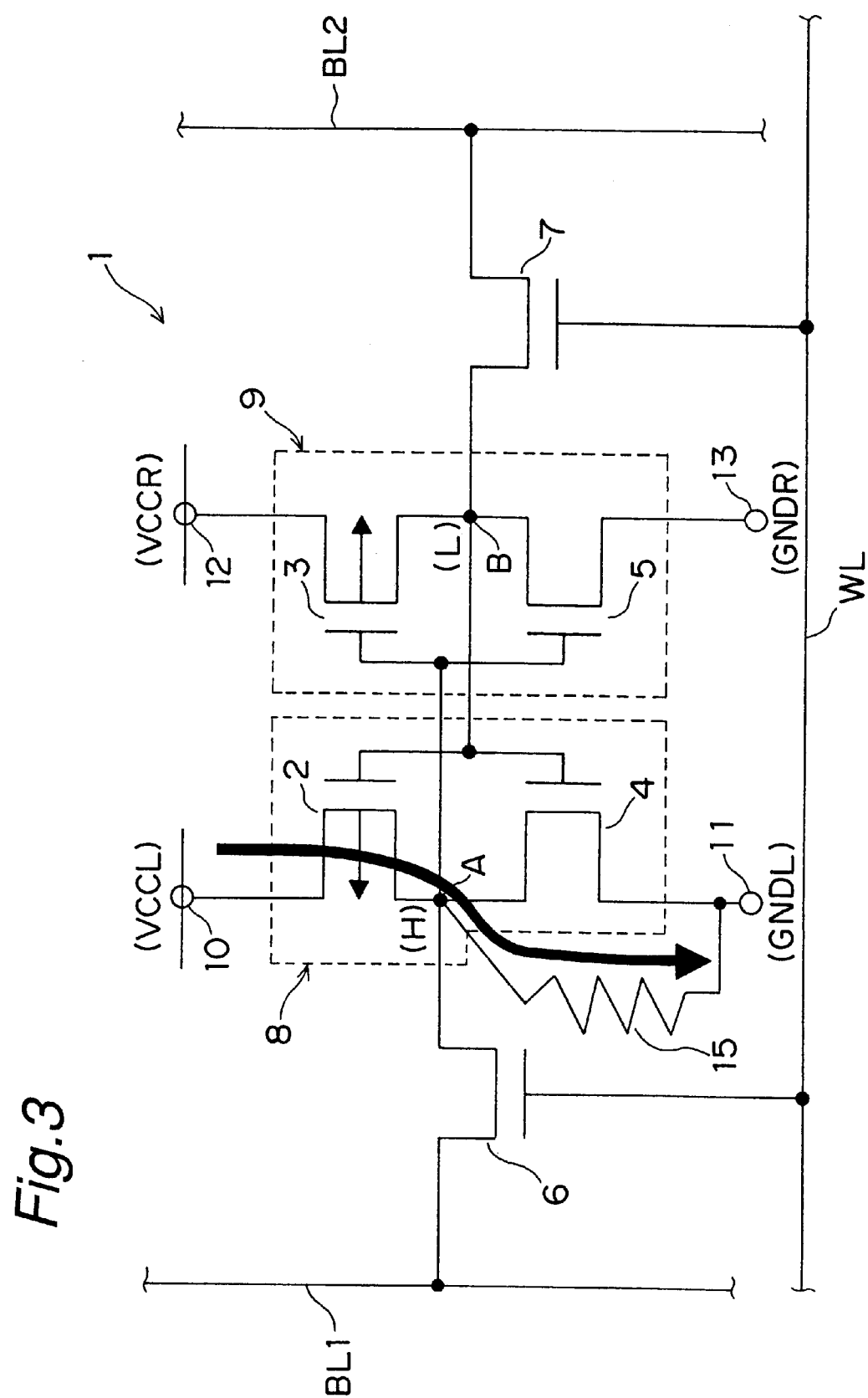
FIG. 3 shows a microshort between memory node A and first negative supply terminal 11 in FIG. 1.

If a microshort occurs due to etching remnants or foreign matter between first negative supply terminal 11 and memory node A as shown in FIG. 3, a high resistance 15 is formed where the microshort occurs, and first negative supply terminal 11 and memory node A are thus connected by this high resistance 15. When the voltage level of memory node A is high, through-current flows from first positive supply terminal 10 to first negative supply terminal 11 by way of PMOS transistor 2 and high resistance 15. This current flows when the memory cell is in the standby state, and the semiconductor chip in which this SRAM cell is formed has a standby state error.

However, current supply capacity to high resistance 15 can improved during the wafer test stage of the manufacturing process by setting the first positive supply voltage VCCL applied to first positive supply terminal 10 to less than the second positive supply voltage VCCR applied to second positive supply terminal 12, and the first negative supply voltage GNDL applied to first negative supply terminal 11 to less than the second negative supply voltage GNDR applied to second negative supply terminal 13. If the current supply capacity to high resistance 15 thus becomes comparable to the drive current capacity of PMOS transistor 2, the voltage level of memory node A will drop and invert from high to low. This makes it possible to detect that a microshort occurred in memory cell 1.

It will be obvious to one with ordinary skill in the related art that while the present embodiment is described and shown in FIG. 2 and FIG. 3 with memory node B being low and memory node A high, memory node B can obviously be high when memory node A is low. In this case the same effect can be achieved if GNDL>GNDR and VCCL>VCCR, again causing the levels of memory node A and memory node B to invert when a microshort occurs.

Figure 4:
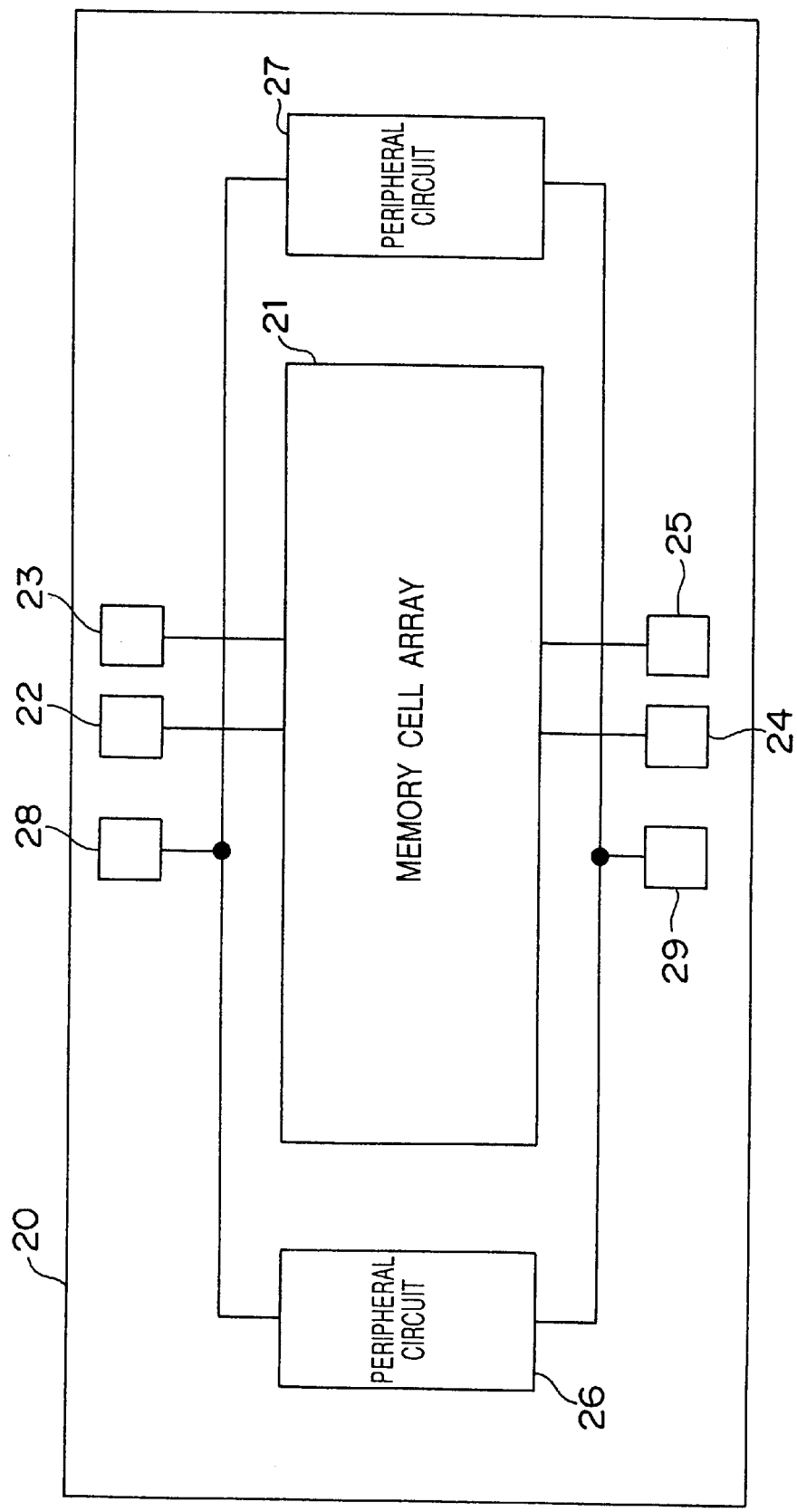
FIG. 4 shows the pad arrangement of the semiconductor integrated circuit shown in FIG. 1.

FIG. 4 shows the pad arrangement of the semiconductor integrated circuit shown in FIG. 1. As shown in FIG. 4, memory cell array 21 has a VCCL pad 22 connected to first positive supply terminal 10 of each memory cell, and VCCR pad 23 connected to second positive supply terminal 12 of each memory cell. The memory cell array 21 also has GNDL pad 24 connected to first negative supply terminal 11 of each memory cell, and GNDR pad 25 connected to the second negative supply terminal 13 of each memory cell. The positive supply terminals of peripheral circuits 26, 27 are connected to VCC pad 28, to which positive supply voltage VCC for the peripheral circuits is applied, and the negative supply terminals of peripheral circuits 26, 27 are connected to GND pad 29, to which the negative supply voltage for the peripheral circuits is applied.

Figure 5:
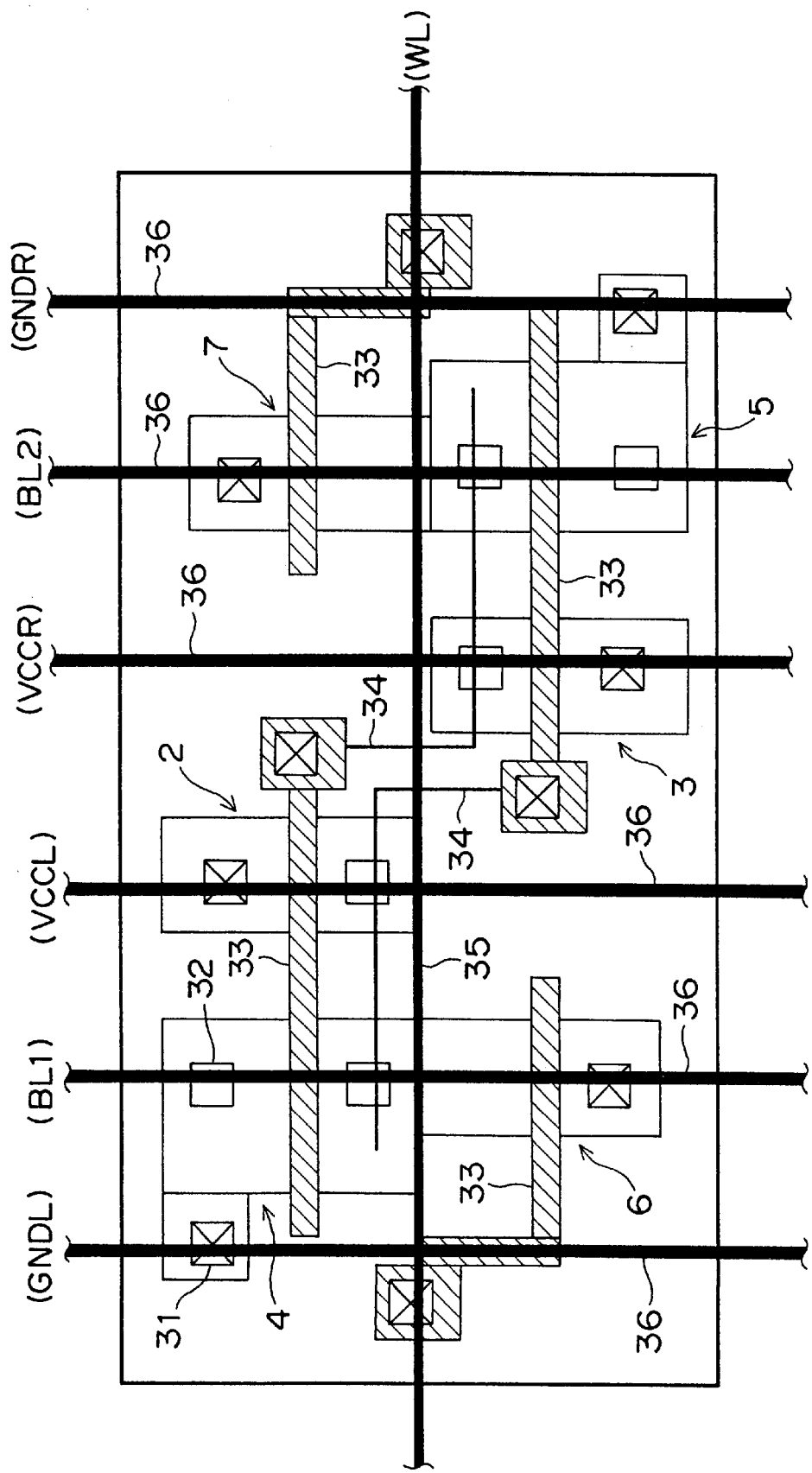
FIG. 5 shows the chip layout of memory cells shown in FIG. 1.

FIG. 5 shows a typical chip layout, particularly the lines formed in the chip, for the memory cells shown in FIG. 1. Shown in FIG. 5 are through-via 31, contact 32, polysilicon line 33, first metal line 34, second metal line 35, and third metal lines 36. As will be known from FIG. 5, the third metal lines 36 to which first positive supply voltage VCCL, second positive supply voltage VCCR, first negative supply voltage GNDL, and second negative supply voltage GNDR are applied are wired independently. It is thus simple to provide a line for supplying VCCL, a line for supplying VCCR, a GNDL line, and a GNDR line.

A different positive supply voltage and a different negative supply voltage is applied to memory cell array 21 and peripheral circuits 26, 27 in the semiconductor integrated circuit described above. A different positive supply voltage can therefore be applied to VCCL pad 22 and VCCR pad 23, and a different negative supply voltage can be applied to the GNDL pad 24 and GNDR pad 25, according to the voltage level of memory node A and memory node B during the wafer test stage of the manufacturing process.

A different positive supply voltage is thus applied to first positive supply terminal 10, that is, the positive supply terminal of first inverter circuit 8, and to second positive supply terminal 12, that is, the positive supply terminal of second inverter circuit 9, and a different negative supply voltage is applied to first negative supply terminal 11, that is, the negative supply terminal of first inverter circuit 8, and to second negative supply terminal 13, that is, the negative supply terminal of second inverter circuit 9, during the wafer test stage of the manufacturing process.

More specifically, the presence of a change in the voltage level of each memory node of each memory cell is detected during the wafer test by first using the following voltage settings: VCC=VCCL<VCCR, and GNDL<GNDR=GND. The voltage settings are then changed to VCC=VCCR<VCCL, and GNDR<GNDL=GND to detect the presence of a change in the voltage level of each memory node of each memory cell. As a result, the voltage levels of memory node A and memory node B can be inverted to detect a defective memory cell if a microshort occurs between a memory node and each positive supply terminal and/or between a memory node and each negative supply terminal.

After thus testing for defective memory cells in the wafer test, VCCL pad 22, VCCR pad 23, and VCC pad 28 are connected, and GNDL pad 24, GNDR pad 25, and GND pad 29 are connected, during the assembly process.

A salvaging technique that can be used when a defective memory cell is detected is described next with reference to FIG. 6.

Figure 6:
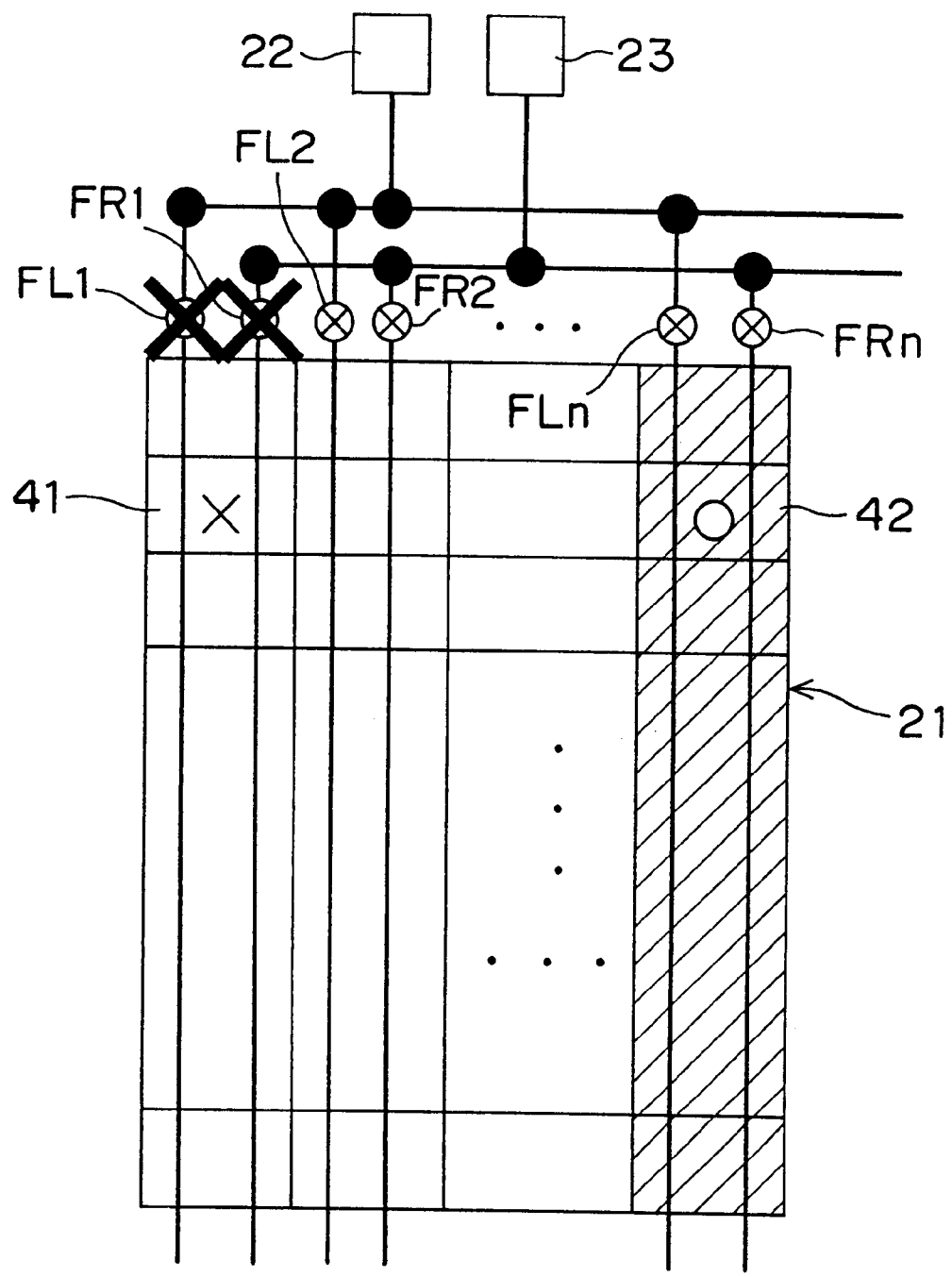
FIG. 6 shows a method for salvaging the semiconductor integrated circuit when a defective memory cell is detected.

The memory cell array 21 shown in FIG. 6 has memory cells arranged in a matrix of m rows by n columns (where m is a natural number and m>0, and n is a natural number and n>1). First positive supply voltage VCCL is applied from VCCL pad 22 through fuses FL1 to FLn, which are disposed for each column of the memory cell array 21. In addition, second positive supply voltage VCCR is applied from VCCR pad 23 to each memory cell through intervening fuses FR1 to FRn, which are disposed for each column of the memory cell array 21.

It is assumed in this semiconductor integrated circuit that the memory cells in at least one column of the memory cell array are redundant memory cells. In this example the redundant memory cells are in column n as shown by the shading in FIG. 6. If, for example, the test described above finds that memory cell 41 in column 1 is defective, the fuses FL1 and FR1 connected to this defective memory cell 41 are isolated from the memory cell by laser trimming, for example.

The corresponding redundant memory cells in the n-th column are then used in place of the memory cells in column 1 for which fuses FL1 and FR1 were interrupted. By thus cutting off fuses FL1 and FR1 connected to the defective memory cell 41, positive voltage supply to the defective memory cell 41 is interrupted and standby current defects can be prevented, thus improving semiconductor chip yield.

Figure 7:
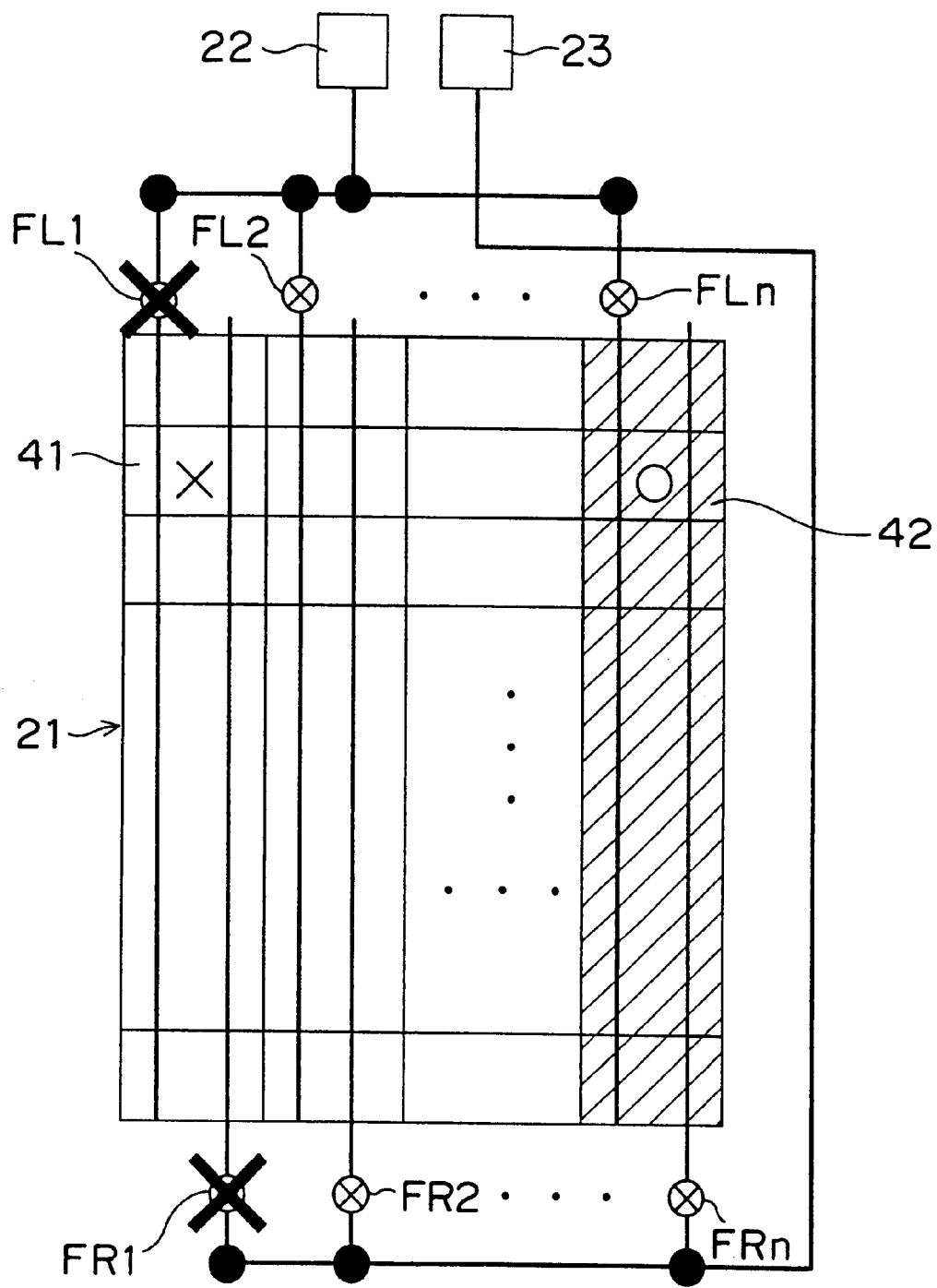
FIG. 7 shows another method for salvaging the semiconductor integrated circuit when a defective memory cell is detected.

It will be obvious to one with ordinary skill in the related art that while fuses FL1 to FLn and FR1 to FRn are alternately disposed in each column, fuses FL1 to FLn and FR1 to FRn can be disposed on alternate sides of the memory cell array 21 as shown in FIG. 7. This makes it possible to increase the pitch at which the fuses are disposed, and thus makes interrupting a fuse easier.

Figure 8A:
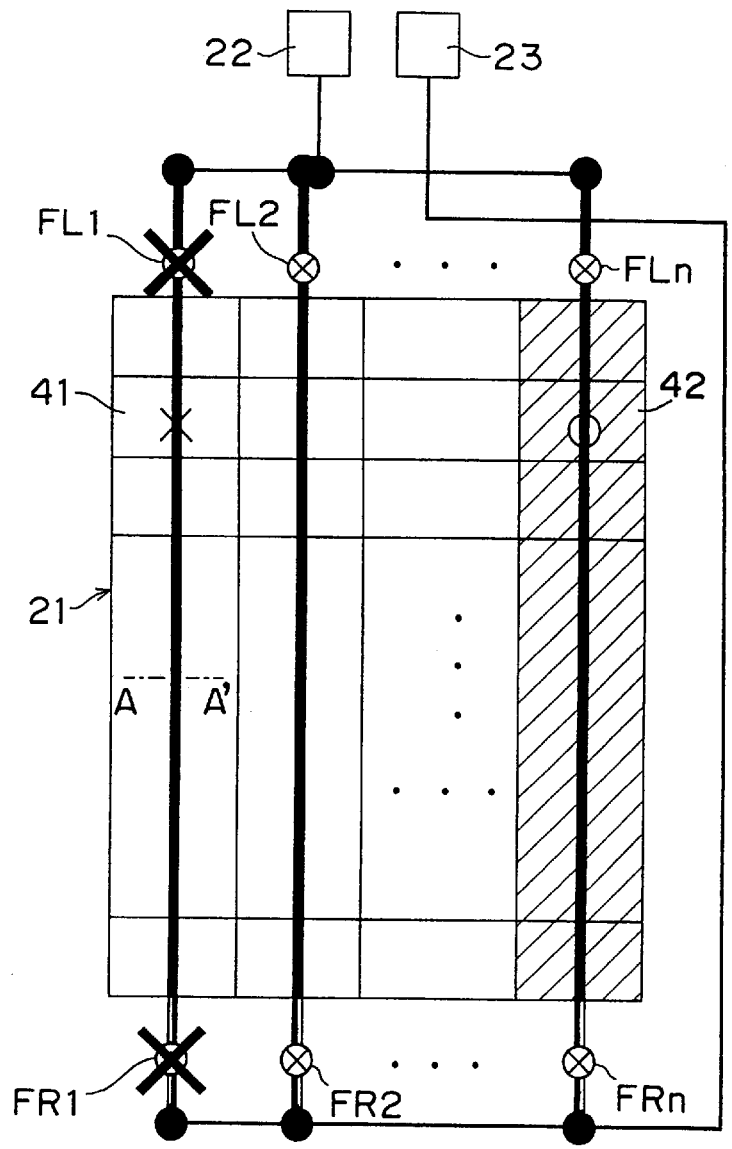
FIG. 8A shows another method for salvaging the semiconductor integrated circuit when a defective memory cell is detected.
Figure 8B:
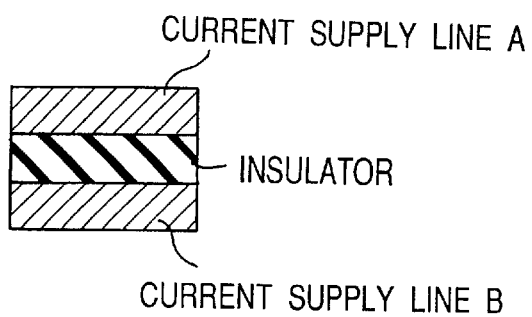
FIG. 8B is a section view of fuse Fn through line A–A' in FIG. 8A.

In contrast with the configuration shown in FIG. 7, it is also possible as shown in FIG. 8B to use a two-layer configuration in which supply line A for supplying first positive supply voltage VCCL to each memory cell, and supply line B for supplying second positive supply voltage VCCR to each memory cell, are on different layers. In this case the distance between the current supply lines can be increased in addition to increasing the fuse pitch. Isolating a fuse in one layer is thus simple and shorts involving the same layer can be eliminated, thus further improving semiconductor chip yield. Note that FIG. 8B is a section view through line A–A' in FIG. 8A.

Figure 9A:
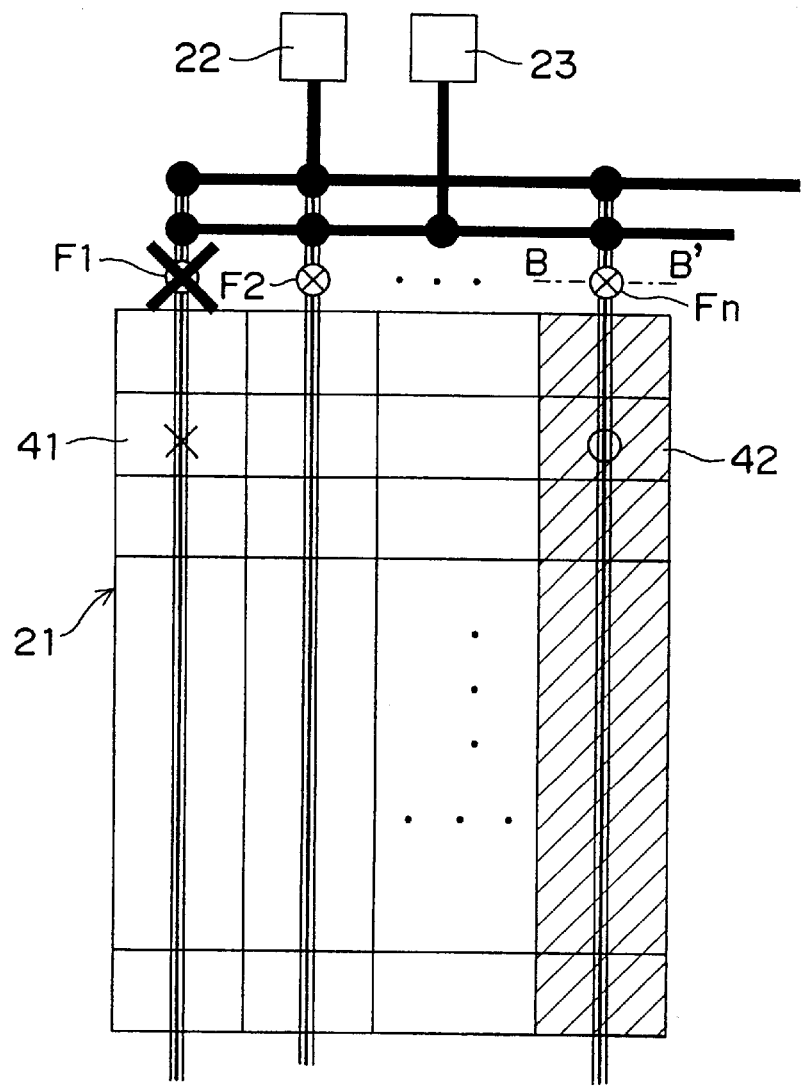
FIG. 9A shows another method for salvaging the semiconductor integrated circuit when a defective memory cell is detected.
Figure 9B:
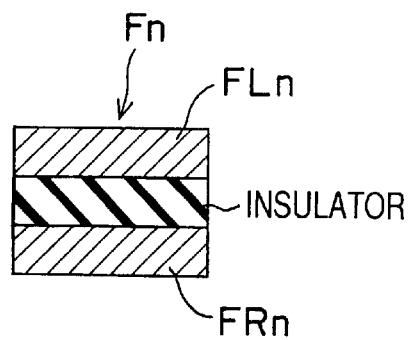
FIG. 9B is a section view of fuse Fn through line B–B' in FIG. 9A.

In contrast with the configuration shown in FIG. 8A, it is also possible as shown in FIG. 9A to use a fuse Fi comprising fuse FLi (where i is a natural number, 1<=i<=n) and fuse FRi on two different layers, with fuses F1 to Fn disposed one per column as shown in FIG. 6. The fuse pitch and wiring pitch can thus be increased, making it even easier to cut off a fuse and use a smaller layout area. It should be noted that FIG. 9B is a section view of fuse Fn through line B–B' in FIG. 9A.

It will also be obvious to one with ordinary skill in the related art that while the present embodiment has been described and shown in FIGS. 6 to 9 with a fuse inserted to the line for applying first positive supply voltage VCCL and second positive supply voltage VCCR to the memory cell array 21, the same effect can be achieved by inserting the fuse to the line for applying first negative supply voltage GNDL and second negative supply voltage GNDR to the memory cell array 21.

It will be known from the above description that a semiconductor integrated circuit according to this first embodiment of the present invention separately applies a positive supply voltage and a negative supply voltage to the two inverter circuits 8 and 9 of the SRAM memory cell 1 during the wafer test stage of the manufacturing process to detect a defective memory cell in which a microshort occurs. Fuses inserted to the voltage supply line for the detected defective memory cell are then cut off to isolate the defective memory cell, and a redundant memory cell predisposed in the memory cell array is substituted for the defective memory cell. By thus being able to easily detect and identify a memory cell in which a microshort occurs, and substituting a redundant memory cell for the memory cell in which a standby current error or other dc current error occurs due to the microshort, semiconductor chip yield can be improved.

Embodiment 2

An n-well voltage VCCN can be applied to PMOS transistors 2 and 3, and a p-well voltage GNDP to NMOS transistors 4 and 5, in the configuration shown in the first embodiment. A semiconductor integrated circuit so comprised is described next as a second embodiment of the present invention.

Figure 10:
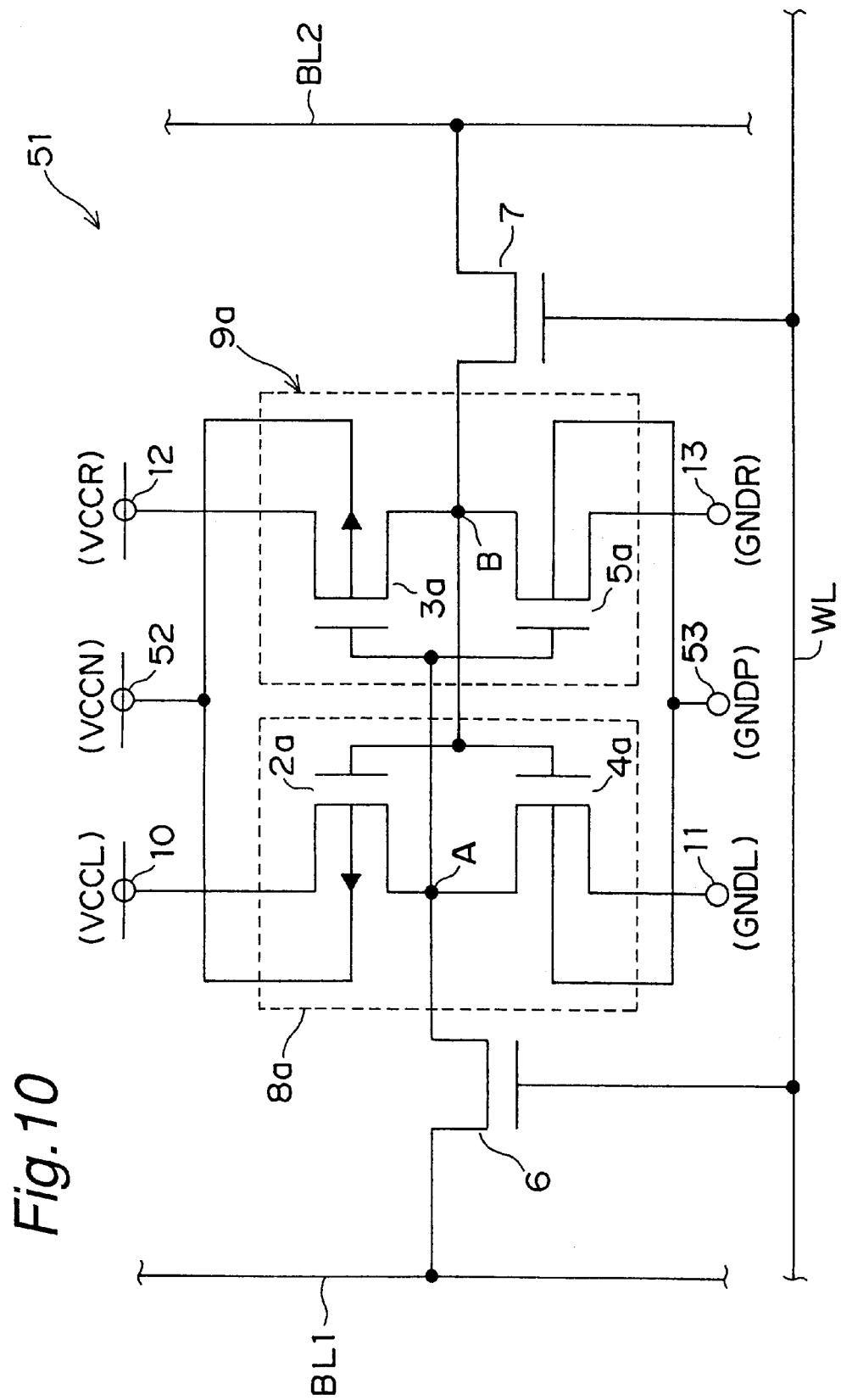
FIG. 10 is a circuit diagram of a semiconductor integrated circuit according to a second embodiment of the present invention.

FIG. 10 is a circuit diagram of a semiconductor IC according to this second preferred embodiment of the invention. This embodiment is also described with reference to an SRAM memory cell in a semiconductor IC. It should be further noted that like parts in FIG. 10 and FIG. 1 are identified by like reference numeral, and further description thereof is omitted below.

The device shown in FIG. 10 differs from that in FIG. 1 in that n-well voltage VCCN is applied to the n-well of PMOS transistors 2 and 3, and p-well voltage GNDP is applied to the p-well of NMOS transistors 4 and 5. PMOS transistor 2 in FIG. 1 is therefore referred to in this embodiment as PMOS transistor 2a, PMOS transistor 3 as PMOS transistor 3a, NMOS transistor 4 as NMOS transistor 4a, and NMOS transistor 5 as NMOS transistor 5a. In conjunction therewith, first inverter circuit 8 of the first embodiment in FIG. 1 is referenced as first inverter circuit 8a, second inverter circuit 9 as second inverter circuit 9a, and memory cell 1 as memory cell 51.

As shown in FIG. 10, the n-wells of PMOS transistors 2a and 3a are connected to n-well voltage input terminal 52 whereby n-well voltage VCCN is applied. The p-wells of NMOS transistors 4a and 5a are connected to p-well voltage input terminal 53 whereby p-well voltage GNDP is applied.

In a semiconductor IC thus comprised, current flows from second positive supply terminal 12 to second negative supply terminal 13 by way of high resistance 15 and NMOS transistor 5a when a microshort occurs between second positive supply terminal 12 and memory node B in FIG. 2 and memory node B goes low. A standby current error is thus present in the semiconductor chip in which the SRAM device is formed.

In this case, however, setting VCCL<VCCR=VCCN and GNDP=GNDL<GNDR during the wafer test stage of the manufacturing process can improve current supply capacity to high resistance 15 and weaken the current supply capacity of NMOS transistor 5a due to the substrate effect. If the current supply capacity to high resistance 15 thus becomes equal to the drive current capacity of NMOS transistor 5a, the voltage of memory node B rises, and the voltage level of memory node B changes from low to high.

Next, if a microshort occurs between memory node A and first negative supply terminal 11 as shown in FIG. 3 and the voltage level of memory node A is high, current flows from first positive supply terminal 10 to first negative supply terminal 11 through PMOS transistor 2a and high resistance 15. A standby current error is thus present in the semiconductor chip in which the SRAM device is formed.

However, as with the FIG. 2 case noted above, setting VCCL<VCCR=VCCN and GNDP=GNDL<GNDR during the wafer test stage of the manufacturing process can improve current supply capacity to high resistance and weaken the current supply capacity of PMOS transistor 2a due to the substrate effect. If the current supply capacity to high resistance 15 thus becomes equal to the drive current capacity of PMOS transistor 2a, the voltage of memory node A drops, and the voltage level of memory node A changes from high to low.

It will be obvious to one with ordinary skill in the related art that while the present embodiment is described with memory node A being high and memory node B low, memory node B can obviously be high and memory node A low. In this case the same effect can be achieved if GNDL>GNDR=GNDP and VCCN=VCCL>VCCR, again causing the levels of memory node A and memory node B to invert when a microshort occurs.

Figure 11:
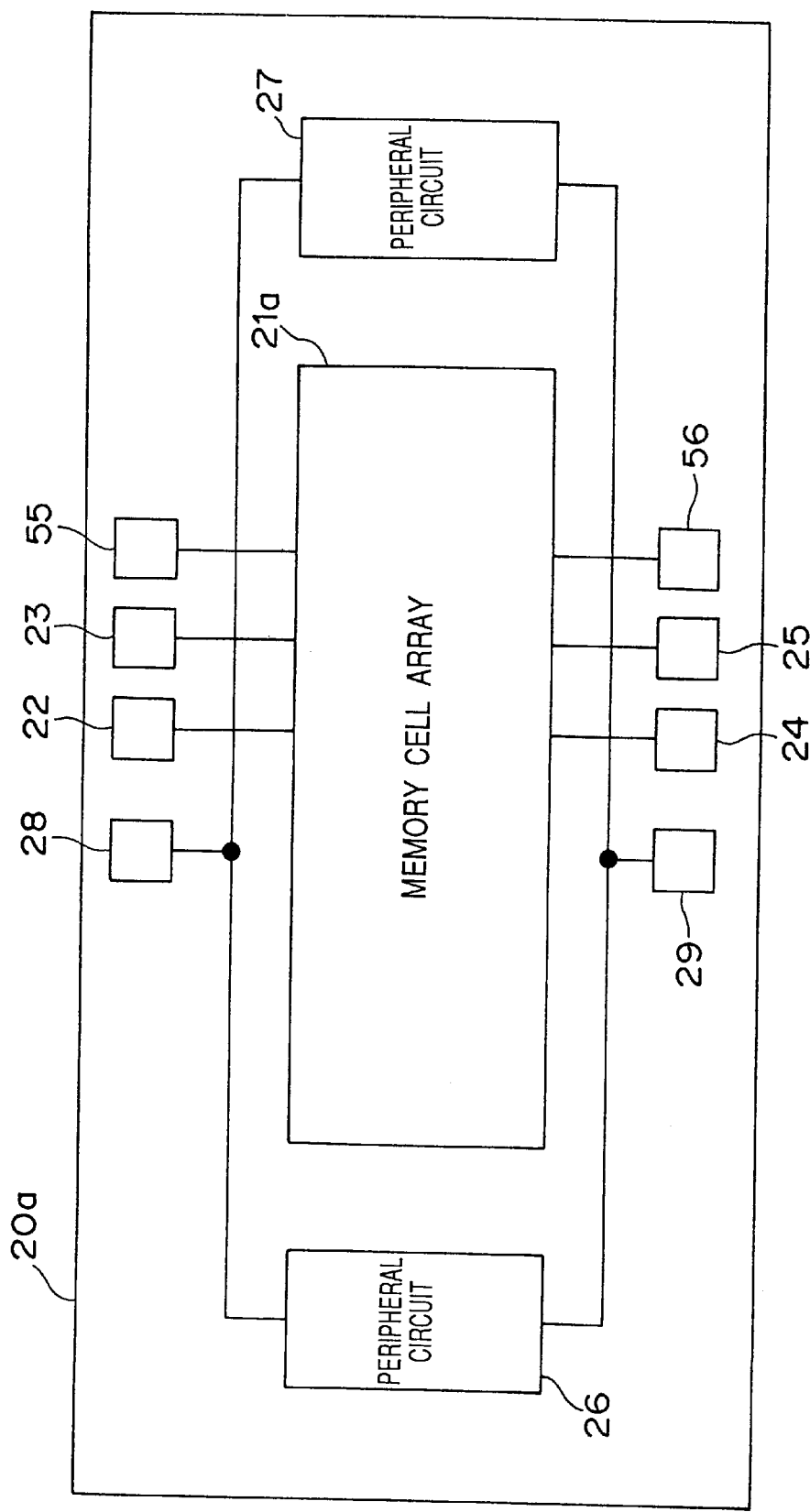
FIG. 11 shows the pad arrangement of the semiconductor integrated circuit shown in FIG. 10.

FIG. 11 shows the pad arrangement of the semiconductor integrated circuit shown in FIG. 10. Note that like parts in FIG. 11 and FIG. 4 are identified by like reference numeral, and further description thereof is omitted below.

The arrangement shown in FIG. 11 differs from that in FIG. 4 in that VCCN pad 55 connected to n-well voltage input terminal 52, and GNDP pad 56 connected to p-well voltage input terminal 53, are additionally disposed to the memory cell array 21. The semiconductor chip 20 shown in FIG. 4 is therefore referred to as semiconductor chip 20a, and memory cell array 21 as memory cell array 21a.

During the wafer test stage of the manufacturing process for this configuration, a different supply voltage is applied to first positive supply terminal 10, that is, the positive supply terminal of first inverter circuit 8a, second positive supply terminal 12, that is, the positive supply terminal of second inverter circuit 9a, and n-well voltage input terminal 52, and a different negative supply voltage is applied to first negative supply terminal 11, that is, the negative supply terminal of first inverter circuit 8a, second negative supply terminal 13, that is, the negative supply terminal of second inverter circuit 9a, and p-well voltage input terminal 53.

More specifically, change in the level of each memory node of each memory cell is first detected during the wafer test stage of the manufacturing process using the voltage settings VCC=VCCL<VCCR=VCCN and GNDP=GNDL<GNDR=GND. The voltages are then set to VCC=VCCR<VCCL=VCCN, and GNDP=GNDR<GNDL=GND, and a change in memory node level is again detected. As a result, the voltage level of memory nodes A and B will change if a microshort occurs between a memory node and positive supply terminal and/or between a memory node and negative supply terminal.

After thus testing for defective memory cells in the wafer test, VCCL pad 22, VCCR pad 23, VCC pad 28, and VCCN pad 55 are connected, and GNDL pad 24, GNDR pad 25, GND pad 29, and GNDP pad 56 are connected, during the assembly process.

A salvaging technique that can be used when a defective memory cell is detected is the same as that described in the first embodiment above, and further description is therefore omitted below.

A semiconductor IC according to this second embodiment of the invention thus complements the semiconductor IC of the above-noted first embodiment by further providing an n-well voltage input terminal 52 for applying n-well voltage VCCN to PMOS transistors 2a and 3a, and p-well voltage input terminal 53 for applying p-well voltage GNDP to NMOS transistors 4a and 5a. During the wafer test stage of the manufacturing process n-well voltage VCCN is separately applied to the positive and negative supply terminals of PMOS transistors 2a and 3a, and p-well voltage GNDP is separately applied to the positive and negative supply terminals of NMOS transistors 4a and 5a to detect a defective memory cell in which a microshort occurs. In addition to the benefits of the above-noted first embodiment, this second embodiment of the invention makes it even easier to detect a memory cell in which a microshort occurs.

It will also be obvious to one with ordinary skill in the related art that while defective memory cells are detected using VCCL<VCCR and GNDL<GNDR in both of the above embodiments, it is also possible to detect defective memory cells if VCCL<VCCR or GNDL<GNDR.

Figure 12:
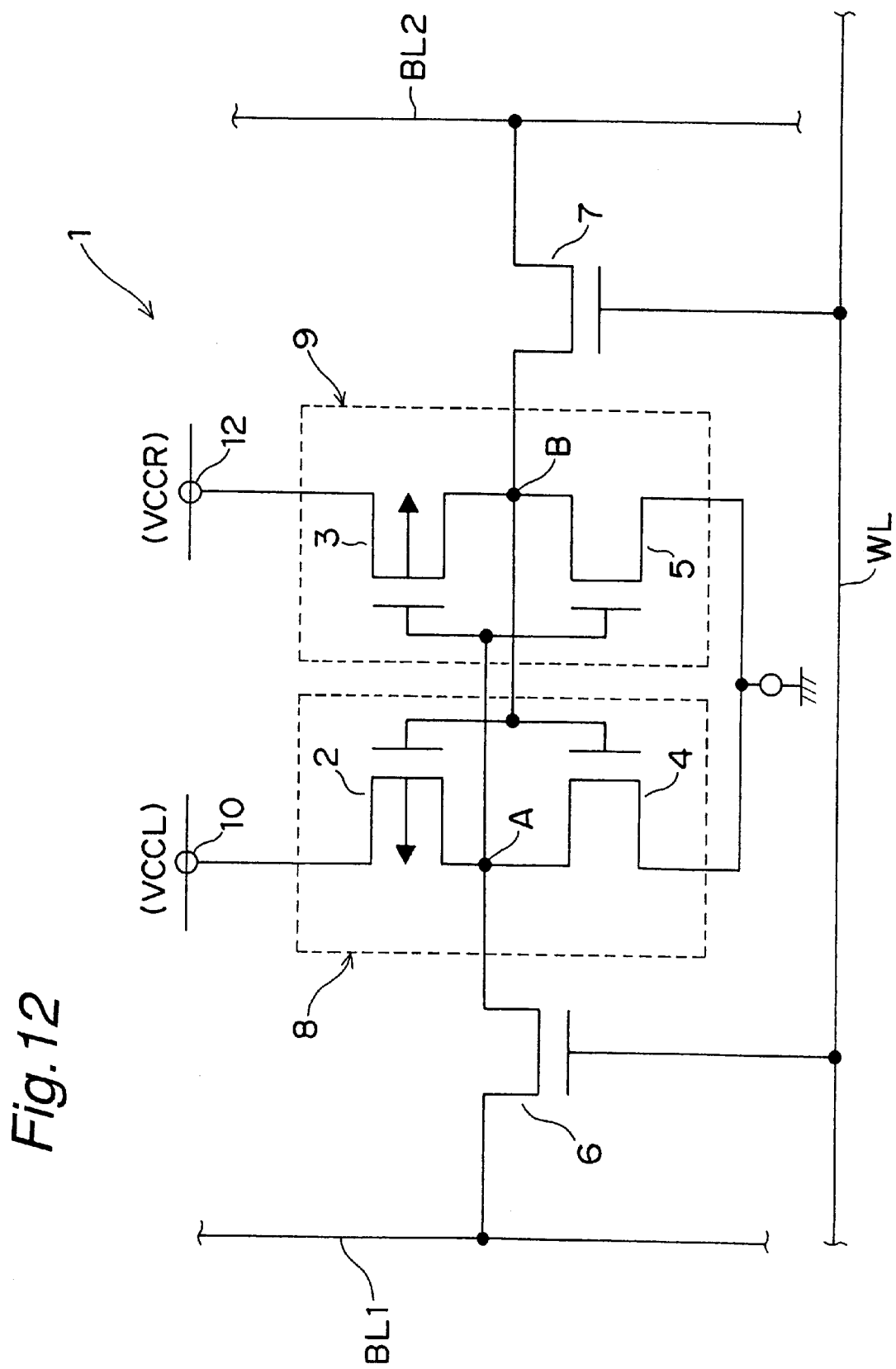
FIG. 12 shows a variation of the semiconductor integrated circuit according to the first embodiment.
Figure 13:
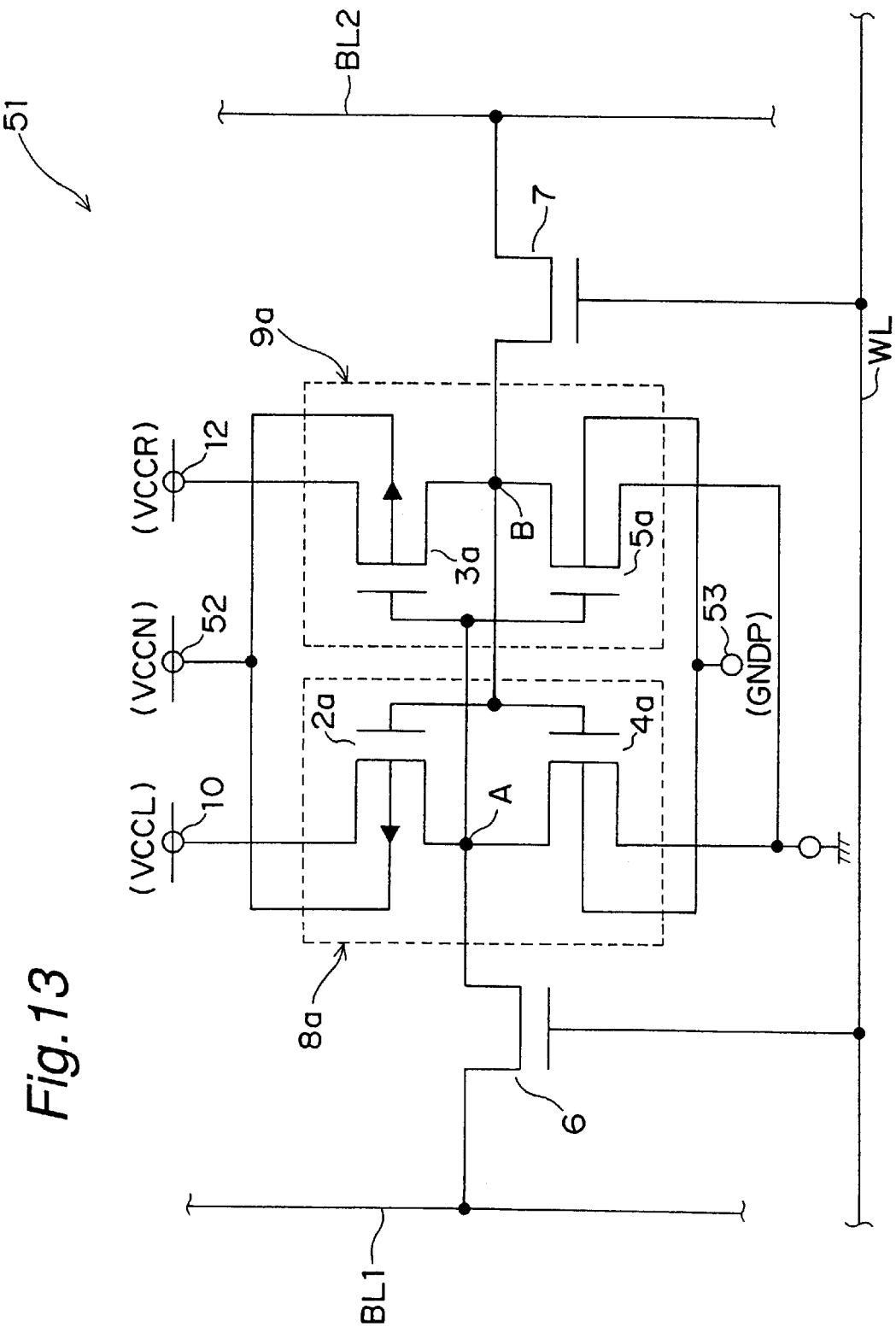
FIG. 13 shows a variation of the semiconductor integrated circuit according to the second embodiment.

Furthermore, the above first and second embodiments have been described having first positive supply terminal 10, first negative supply terminal 11, second positive supply terminal 12, and second negative supply terminal 13, but it is also possible to provide only first positive supply terminal 10 and second positive supply terminal 12. In this case the same negative supply voltage, such as the ground voltage as shown in FIG. 12 and FIG. 13, is applied to the first and second inverter circuits.

Figure 14:
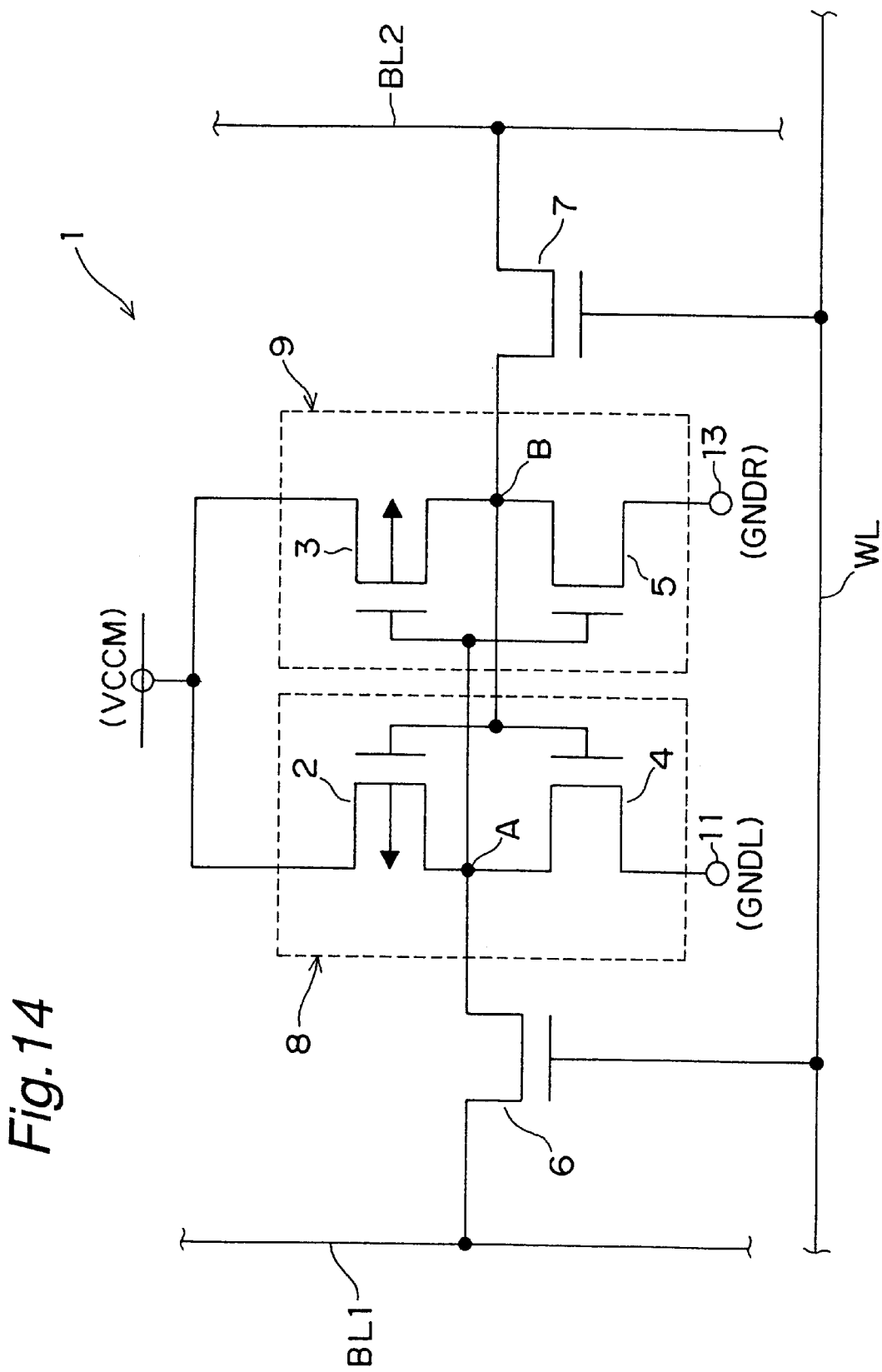
FIG. 14 shows another variation of the semiconductor integrated circuit according to the first embodiment.
Figure 15:
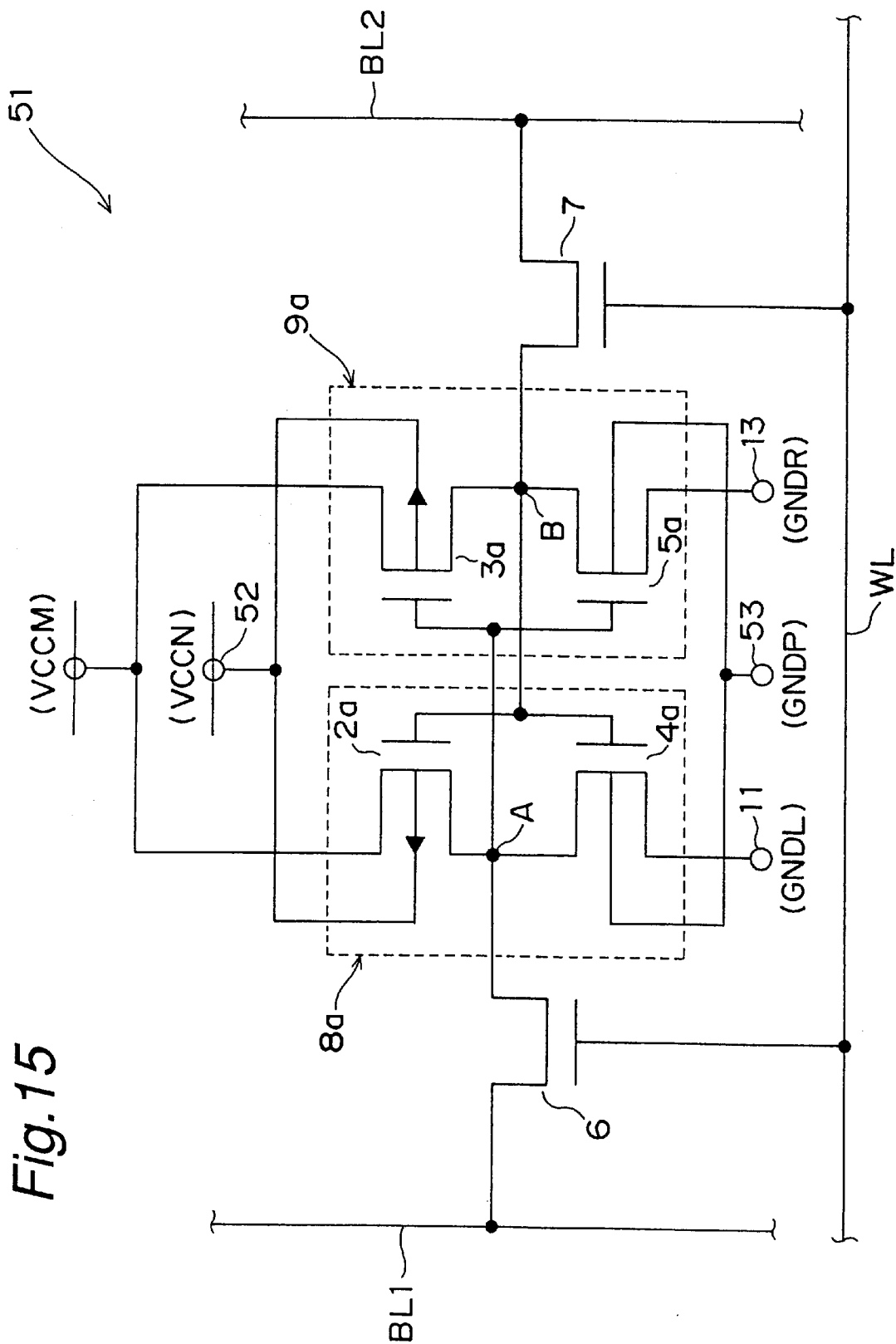
FIG. 15 shows another variation of the semiconductor integrated circuit according to the second embodiment.
Figure 16:
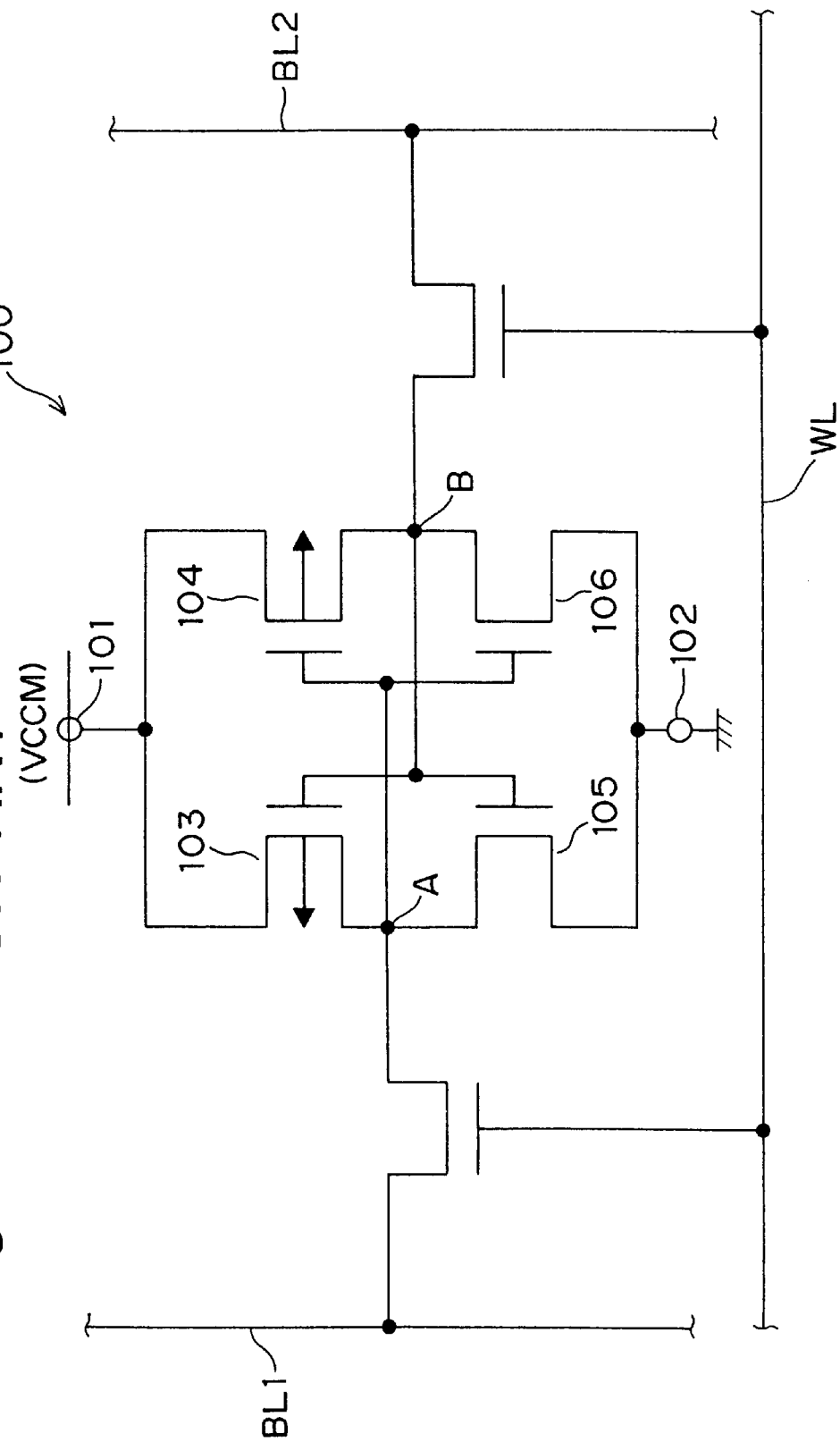
FIG. 16 shows the chip configuration and supply pad layout in a semiconductor integrated circuit according to the related art.
Figure 17:
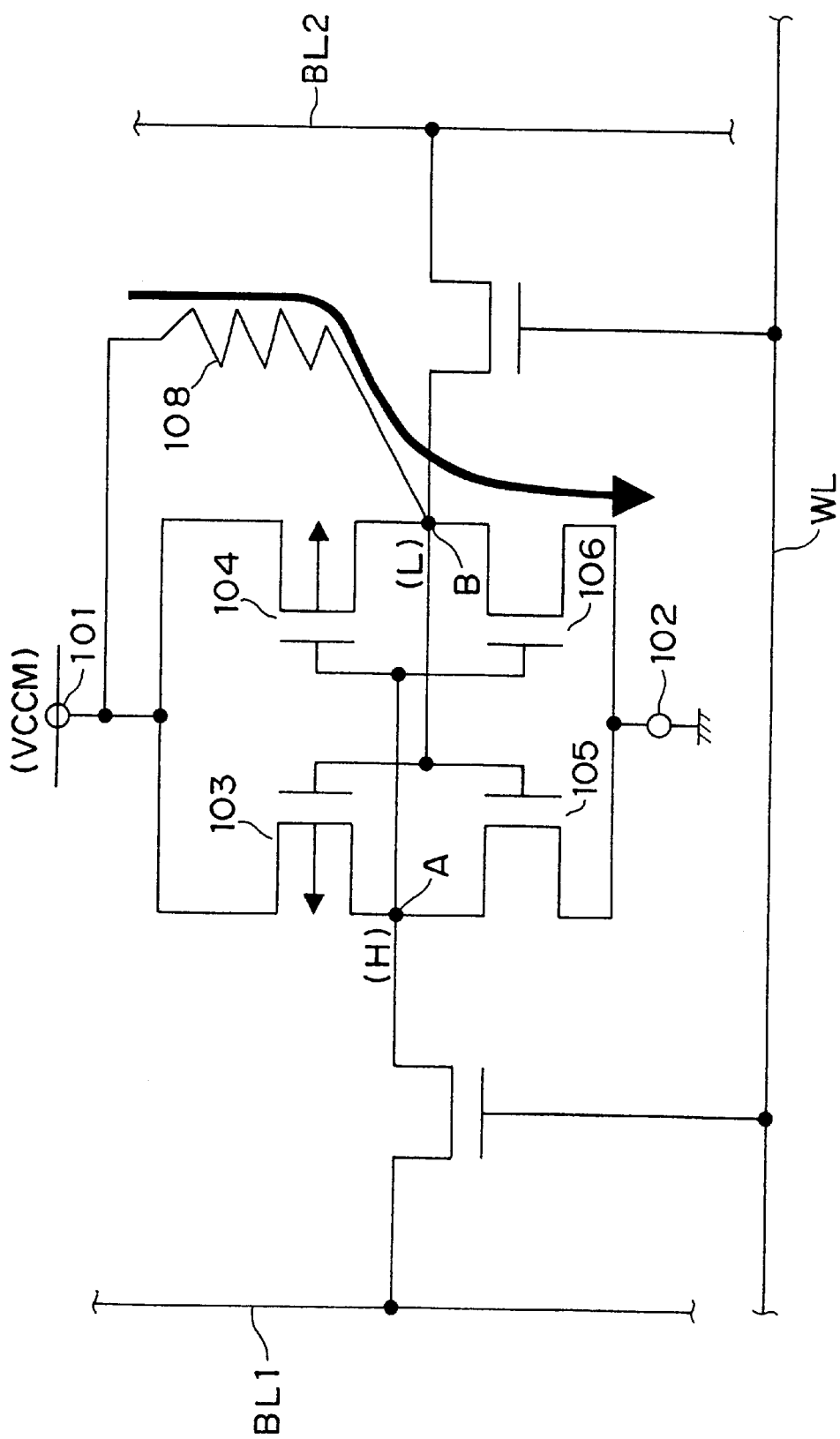
FIG. 17 shows a microshort between memory node B and positive supply terminal 101 in FIG. 16.
Figure 18:
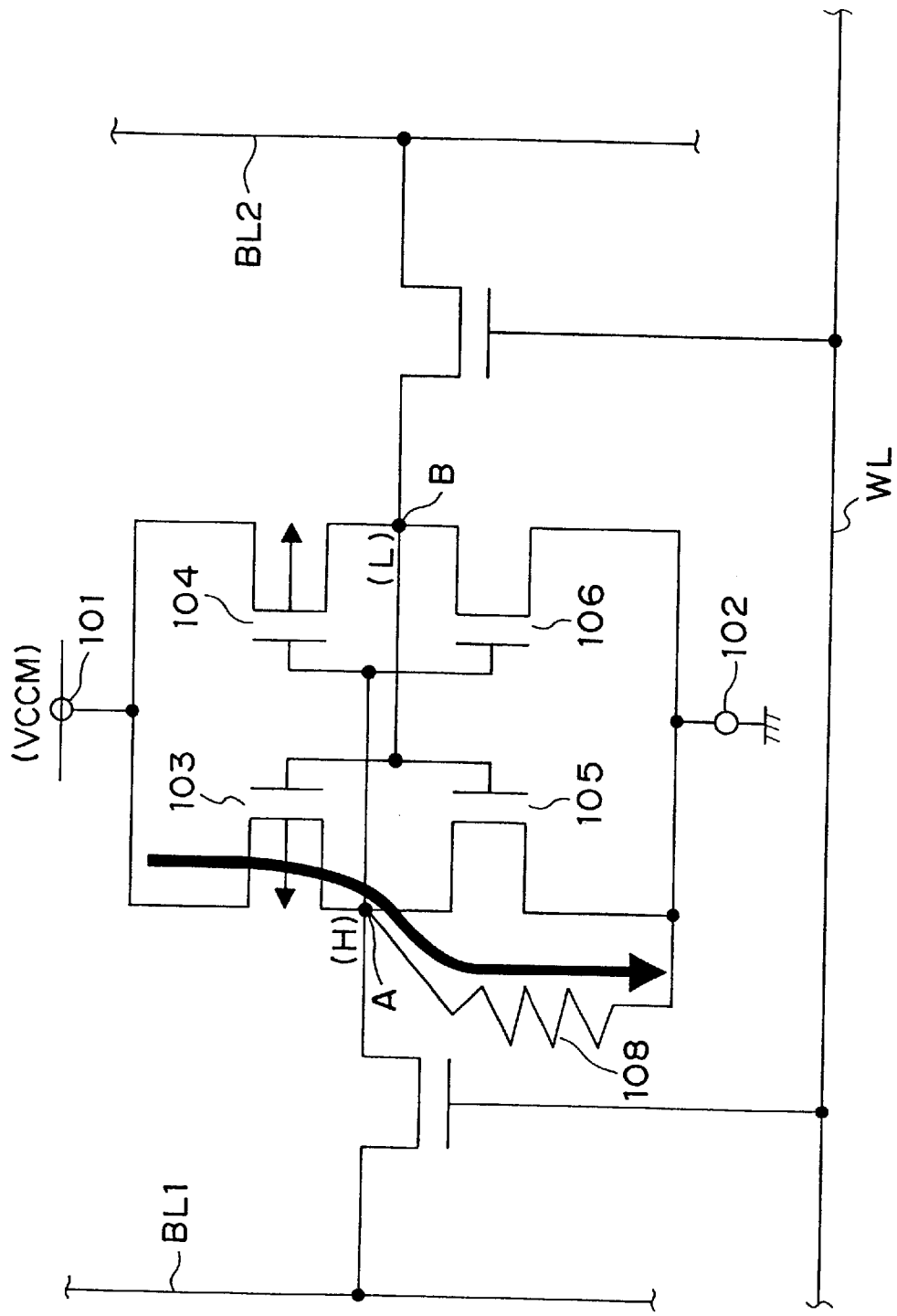
FIG. 18 shows a microshort between memory node A and negative supply terminal 102 in FIG. 16.
Figure 19:
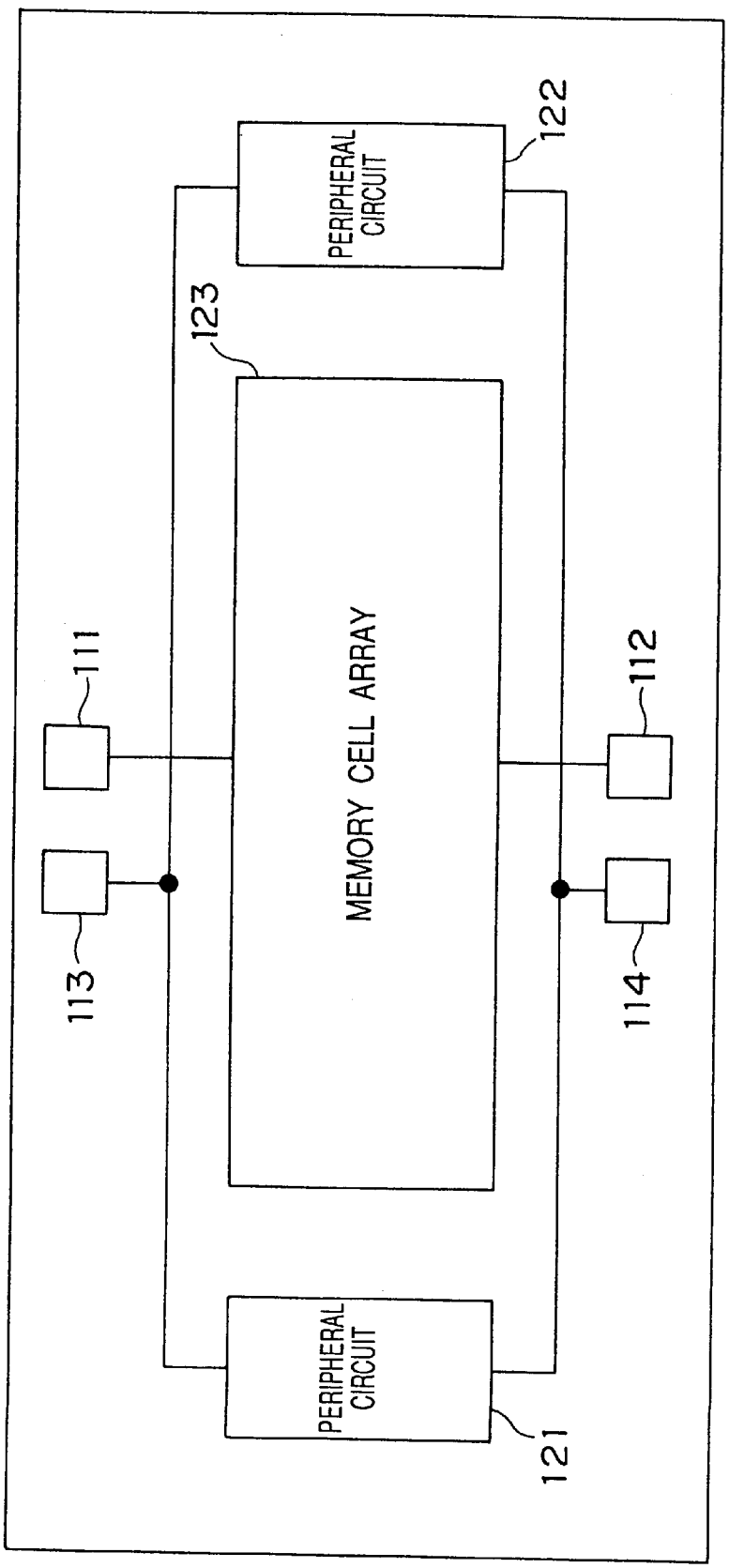
FIG. 19 shows the pad arrangement in a semiconductor integrated circuit according to the related art.

It is likewise also possible to provide only first negative supply terminal 11 and second negative supply terminal 13. In this case, the same positive supply voltage, such as the positive supply voltage VCCM of the memory cell as shown in FIG. 14 and FIG. 15, is applied to both first and second inverter circuits. The defective memory cell detecting operation and salvaging method used when a defective memory cell is detected are the same as in the first and second embodiments above, and further description thereof is thus omitted below.

As hereinbefore fully described, in a semiconductor integrated circuit according to a first aspect of the present invention, a positive supply voltage is separately applied during the wafer test stage of the manufacturing process to the two inverter circuits of the SRAM memory cell. It is therefore possible to easily detect a memory cell in which a high resistance occurs due to a microshort, and by then substituting a redundant memory cell for the defective memory cell to improve yield.

Yet further preferably, the same positive supply voltage is applied to the first and second positive supply terminals during normal operation. As a result, a specific desired operation can be accomplished during normal operation.

Yet further preferably, each memory cell also has an n-well voltage input terminal whereby an n-well voltage is applied to each MOS transistor of the first and second inverter circuits. Thus applying voltage to the n-well voltage input terminal makes it even easier to detect and identify the memory cell where a microshort occurs.

Yet further preferably, the greater of the first positive supply voltage and the second positive supply voltage is applied to the n-well voltage input terminal during wafer testing. As a result, it is even easier to detect and identify the memory cell where a microshort occurs.

In a semiconductor integrated circuit according to a fifth aspect of the present invention, a negative supply voltage is separately applied during the wafer test stage of the manufacturing process to the two inverter circuits of the SRAM memory cell. It is therefore possible to easily detect a memory cell in which a high resistance occurs due to a microshort, and by then substituting a redundant memory cell for the defective memory cell to improve yield.

Yet further preferably in this case, a specific negative supply voltage is applied during normal operation to the first negative supply terminal and second negative supply terminal. As a result, a specific desired operation can be accomplished during normal operation.

Yet further preferably, each memory cell further comprises a p-well voltage input terminal whereby a p-well voltage is applied to each MOS transistor of the first and second inverter circuits. Thus applying voltage to the p-well voltage input terminal makes it even easier to detect and identify the memory cell where a microshort occurs.

Yet further preferably, the lesser of the first negative supply voltage and the second negative supply voltage is applied to the p-well voltage input terminal during wafer testing. As a result, it is even easier to detect and identify a memory cell where a microshort occurs.

In a semiconductor integrated circuit according to a ninth aspect of the present invention, both positive and negative supply voltages are separately applied during the wafer test stage of the manufacturing process to the two inverter circuits of the SRAM memory cell. It is therefore possible to easily detect a memory cell in which a high resistance occurs due to a microshort, and by then substituting a redundant memory cell for the defective memory cell to improve yield.

Yet further preferably, a specific positive supply voltage is preferably applied during normal operation to the first and second positive supply terminals, and a specific negative supply voltage is applied during normal operation to the first and second negative supply terminals. As a result, a specific desired operation can be accomplished during normal operation.

Yet further preferably, each memory cell further comprises an n-well voltage input terminal whereby an n-well voltage is applied to each MOS transistor of the first and second inverter circuits, and a p-well voltage input terminal whereby a p-well voltage is applied to each MOS transistor of the first and second inverter circuits. Thus applying voltage to the n-well voltage input terminal and the p-well voltage input terminal makes it even easier to detect and identify the memory cell where a microshort occurs.

Yet further preferably, the greater of the first positive supply voltage and the second positive supply voltage is applied to the n-well voltage input terminal, and the lesser of the first negative supply voltage and the second negative supply voltage is applied to the p-well voltage input terminal, during wafer testing. As a result, it is even easier to detect and identify a memory cell where a microshort occurs.

Yet further preferably, the semiconductor integrated circuit further comprises a corresponding fuse for breaking each line disposed for applying the first positive supply voltage and second positive supply voltage to each specific memory cell group of the memory cell array. This makes it possible to interrupt the fuse inserted to the line where a defective memory cell is detected and thereby interrupt applying a positive supply voltage thereto while also substituting a redundant memory cell in the memory cell array for the defective memory cell.

Yet further preferably, the semiconductor integrated circuit also comprises a corresponding fuse for breaking each line disposed for applying the first negative supply voltage and second negative supply voltage to each specific memory cell group of the memory cell array. This makes it possible to interrupt the fuse inserted to the line where a defective memory cell is detected and thereby interrupt applying a negative supply voltage thereto while also substituting a redundant memory cell in the memory cell array for the defective memory cell.

Yet further preferably, the fuses are arranged alternately above and below or right and left to the memory cell array. This increases the distance between adjacent fuses, and thus makes it easier to open a particular fuse.

Yet further preferably, the lines are disposed in two layers, and the fuses are disposed to each line in each layer. This increases the pitch between the fuses and increases the distance between power supply lines. It is therefore even easier to open a fuse to isolate a defective memory cell while also eliminating shortcircuits between the same wiring layers, and to thus improve semiconductor chip yield.

Yet further preferably, each memory cell of the memory cell array is a CMOS device. As a result, identifying a specific memory cell where a high resistance occurs due to a microshort is simple.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A semiconductor integrated circuit having a memory cell array of SRAM memory cells, each memory cell comprising:

a first positive supply terminal to which a specific first positive supply voltage is applied during wafer testing;

a second positive supply terminal to which a specific second positive supply voltage is applied during wafer testing;

a negative supply terminal to which a specific negative supply voltage is applied;

a first inverter circuit of which the supply voltages applied to the first positive supply terminal and negative supply terminal are a power supply; and a second inverter circuit of which the supply voltages applied to the second positive supply terminal and negative supply terminal are a power supply.

2. A semiconductor integrated circuit according to claim 1, wherein a specific positive supply voltage is applied during normal operation to the first positive supply terminal and second positive supply terminal.

3. A semiconductor integrated circuit according to claim 1, wherein each memory cell further comprises an n-well voltage input terminal whereby an n-well voltage is applied to each MOS transistor of the first and second inverter circuits.

4. A semiconductor integrated circuit according to claim 3, wherein during wafer testing a greater of the first positive supply voltage and the second positive supply voltage is applied to the n-well voltage input terminal.

5. A semiconductor integrated circuit having a memory cell array of SRAM memory cells, each memory cell comprising:
   a positive supply terminal to which a specific positive supply voltage is applied;
   a first negative supply terminal to which a specific first negative supply voltage is applied during wafer testing;
   a second negative supply terminal to which a specific second negative supply voltage is applied during wafer testing;
   a first inverter circuit of which the supply voltages applied to the positive supply terminal and first negative supply terminal are a power supply; and
   a second inverter circuit of which the supply voltages applied to the positive supply terminal and second negative supply terminal are a power supply.

6. A semiconductor integrated circuit according to claim 5, wherein a specific negative supply voltage is applied during normal operation to the first negative supply terminal and second negative supply terminal.

7. A semiconductor integrated circuit according to claim 5, wherein each memory cell further comprises a p-well voltage input terminal whereby a p-well voltage is applied to each MOS transistor of the first and second inverter circuits.

8. A semiconductor integrated circuit according to claim 7, wherein during wafer testing a lesser of the first negative supply voltage and the second negative supply voltage is applied to the p-well voltage input terminal.

9. A semiconductor integrated circuit having a memory cell array of SRAM memory cells, each memory cell comprising:
   a first positive supply terminal to which a specific first positive supply voltage is applied during wafer testing;
   a first negative supply terminal to which a specific first negative supply voltage is applied during wafer testing;
   a second positive supply terminal to which a specific second positive supply voltage is applied during wafer testing;
   a second negative supply terminal to which a specific second negative supply voltage is applied during wafer testing;
   a first inverter circuit of which the supply voltages applied to the first positive supply terminal and first negative supply terminal are a power supply; and
   a second inverter circuit of which the supply voltages applied to the second positive supply terminal and second negative supply terminal are a power supply.

10. A semiconductor integrated circuit according to claim 9, wherein a specific positive supply voltage is applied during normal operation to the first positive supply terminal and second positive supply terminal, and a specific negative supply voltage is applied during normal operation to the first negative supply terminal and second negative supply terminal.

11. A semiconductor integrated circuit according to claim 9, wherein each memory cell further comprises an n-well voltage input terminal whereby an n-well voltage is applied to each MOS transistor of the first and second inverter circuits, and a p-well voltage input terminal whereby a p-well voltage is applied to each MOS transistor of the first and second inverter circuits.

12. A semiconductor integrated circuit according to claim 11, wherein during wafer testing a greater of the first positive supply voltage and the second positive supply voltage is applied to the n-well voltage input terminal, and during wafer testing a lesser of the first negative supply voltage and the second negative supply voltage is applied to the p-well voltage input terminal.

13. A semiconductor integrated circuit according to claim 1, further comprising a corresponding fuse for breaking each line disposed for applying the first positive supply voltage and second positive supply voltage to each specific memory cell group of the memory cell array.

14. A semiconductor integrated circuit according to claim 9, further comprising a corresponding fuse for breaking each line disposed for applying the first positive supply voltage and second positive supply voltage to each specific memory cell group of the memory cell array.

15. A semiconductor integrated circuit according to claim 5, further comprising a corresponding fuse for breaking each line disposed for applying the first negative supply voltage and second negative supply voltage to each specific memory cell group of the memory cell array.

16. A semiconductor integrated circuit according to claim 9, further comprising a corresponding fuse for breaking each line disposed for applying the first negative supply voltage and second negative supply voltage to each specific memory cell group of the memory cell array.

17. A semiconductor integrated circuit according to claim 13, wherein the fuses are arranged alternately above and below or right and left to the memory cell array.

18. A semiconductor integrated circuit according to claim 14, wherein the fuses are arranged alternately above and below or right and left to the memory cell array.

19. A semiconductor integrated circuit according to claim 13, wherein the lines are disposed in two layers, and said fuses are disposed to each line in each layer.

20. A semiconductor integrated circuit according to claim 14, wherein the lines are disposed in two layers, and said fuses are disposed to each line in each layer.

* * * * *